(12) United States Patent
Lee et al.

(10) Patent No.: US 12,324,246 B2
(45) Date of Patent: Jun. 3, 2025

(54) SEMICONDUCTOR DEVICE AND LAYOUT METHOD OF THE SAME

(71) Applicant: Samsung Electronics Co., Ltd., Suwon-si (KR)

(72) Inventors: Jaeha Lee, Yongin-si (KR); Hyeongkyu Kim, Suwon-si (KR); Taejun Yoo, Suwon-si (KR); Unseon Cheon, Yeoju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 525 days.

(21) Appl. No.: 17/722,683

(22) Filed: Apr. 18, 2022

(65) Prior Publication Data

US 2023/0029260 A1 Jan. 26, 2023

(30) Foreign Application Priority Data

Jul. 20, 2021 (KR) ........................ 10-2021-0095033

(51) Int. Cl.
*H10D 89/10* (2025.01)
*G06F 30/392* (2020.01)

(52) U.S. Cl.
CPC ........... *H10D 89/10* (2025.01); *G06F 30/392* (2020.01)

(58) Field of Classification Search
CPC ...... G06F 30/392; G06F 30/39; G06F 30/398; G06F 30/394; G06F 30/3953; G06F 2119/18; G06F 2115/12; G06F 2119/06; H01L 27/0207; H01L 23/528; H01L 23/5226; H01L 27/0924; H01L 29/41791; H01L 27/11807; H01L 21/76898; H01L 23/5286; H01L 27/092; H01L 29/78696; H01L 23/5283; H01L 29/42392; H01L 29/0673; H01L 29/7851; H01L 23/5222; H01L 29/775; H01L 29/785; H01L 23/5252; H01L 2027/11881; H01L 2027/11887; H01L 2027/11875; H03K 3/0372; H03K 3/037; B82Y 10/00; H10B 20/25

See application file for complete search history.

(56) References Cited

U.S. PATENT DOCUMENTS

| | | | |
|---|---|---|---|
| 9,893,009 B2 | 2/2018 | Chen et al. | |
| 10,509,887 B2 | 12/2019 | Chen et al. | |
| 10,922,470 B2 | 2/2021 | Yang et al. | |
| 2016/0049395 A1* | 2/2016 | Okagaki | G06F 30/394 |
| | | | 257/401 |
| 2017/0032074 A1* | 2/2017 | Song | H01L 27/11807 |
| 2017/0179134 A1* | 6/2017 | Liaw | H01L 29/7827 |
| 2017/0221904 A1* | 8/2017 | Liaw | G11C 8/16 |
| 2018/0173836 A1* | 6/2018 | Song | H01L 27/0207 |
| 2018/0226336 A1* | 8/2018 | Kim | H01L 27/0207 |

(Continued)

*Primary Examiner* — Mouloucoulaye Inoussa
(74) *Attorney, Agent, or Firm* — Harness, Dickey & Pierce, P.L.C.

(57) ABSTRACT

A semiconductor device according to an embodiment of the present inventive concept includes a plurality of standard cells in a first direction and a second direction, parallel to an upper surface of a substrate and intersecting with each other, and each of the plurality of standard cells having one or more gate structures and one or more active regions, and in some standard cells providing the same circuit and in standard cell regions at different locations, input lines or/and output lines are at different locations.

20 Claims, 30 Drawing Sheets

(56) References Cited

U.S. PATENT DOCUMENTS

| | | | |
|---|---|---|---|
| 2018/0254287 A1* | 9/2018 | Seo ..................... | H01L 23/528 |
| 2019/0155983 A1 | 5/2019 | Chen et al. | |
| 2019/0197214 A1* | 6/2019 | Chae .................... | G06F 30/394 |
| 2019/0325107 A1* | 10/2019 | Kim ..................... | H01L 23/528 |
| 2020/0105768 A1* | 4/2020 | Liaw .................... | H10B 10/12 |
| 2020/0395354 A1* | 12/2020 | Lee ..................... | G06F 30/394 |
| 2021/0057023 A1* | 2/2021 | Liaw ................ | H01L 29/78696 |
| 2021/0126014 A1* | 4/2021 | Kim ..................... | H10B 51/20 |
| 2021/0134784 A1* | 5/2021 | Kim ................. | H01L 29/78696 |
| 2021/0134785 A1* | 5/2021 | Yang .................... | H01L 23/528 |
| 2021/0143800 A1* | 5/2021 | Lee ..................... | H01L 27/0924 |
| 2021/0343698 A1* | 11/2021 | Peng ................. | H01L 29/0696 |
| 2021/0343744 A1* | 11/2021 | Chiu ................... | H03K 3/0372 |
| 2021/0384203 A1* | 12/2021 | Chang ................. | H01L 23/528 |

* cited by examiner

SEMICONDUCTOR DEVICE AND LAYOUT METHOD OF THE SAME

CROSS-REFERENCE TO RELATED APPLICATION(S)

This application claims benefit of priority to Korean Patent Application No. 10-2021-0095033 filed on Jul. 20, 2021, in the Korean Intellectual Property Office, the disclosure of which is incorporated herein by reference in its entirety.

BACKGROUND

The present inventive concepts relate to a semiconductor device and a layout method of the same.

Semiconductor devices may include semiconductor elements formed on a semiconductor substrate, wirings for connecting the semiconductor elements, and/or the like, and may be designed by arranging and connecting standard cells predefined in a library. As a degree of integration of semiconductor devices increases, various methods for more efficiently arranging wirings for connecting semiconductor elements may be advantageous.

SUMMARY

An aspect of the present inventive concepts is to provide a semiconductor device capable of increasing a degree of design freedom and/or efficiently arranging wirings, and a layout method thereof, by selecting a position of at least one of an input line connecting two or more gate structures to each other or an output line connecting two or more active regions to each other, among a plurality of candidates, in standard cells.

According to an aspect of the present inventive concepts, a semiconductor device includes a plurality of standard cells in a first direction and a second direction, parallel to an upper surface of a substrate and intersecting with each other, and each of the plurality of standard cells having one or more gate structures and one or more active regions, wherein the plurality of standard cells comprise first standard cells in a first standard cell region and a second standard cell region, defined in different positions in at least one of the first direction or the second direction, and the first standard cells provides the same circuit, wherein the first standard cell in the first standard cell region comprises a first input line connecting input wirings connected to two or more gate structures to each other, and a first output line connecting output wirings connected to two or more active regions to each other, and the first standard cell in the second standard cell region comprises a second input line connecting input wirings connected to two or more gate structures to each other, and a second output line connecting output wirings connected to two or more active regions to each other, wherein a position of the first input line in the first standard cell region is different from a position of the second input line in the second standard cell region, or a position of the first output line in the first standard cell region is different from a position of the second output line in the second standard cell region.

According to an aspect of the present inventive concepts, a semiconductor device includes a plurality of standard cells in a first direction and a second direction, parallel to an upper surface of a substrate and intersecting with each other, and each of the plurality of standard cells having one or more gate structures and one or more active regions, wherein the plurality of standard cells comprise first standard cells in a first standard cell region and a second standard cell region, defined in different positions in at least one of the first direction or the second direction, and the first standard cells provides the same circuit, wherein the first standard cell in the first standard cell region comprises a first input line connecting input wirings connected to two or more gate structures to each other, and a first output line connecting output wirings connected to two or more active regions to each other, and the first standard cell in the second standard cell region comprises a second input line connecting input wirings connected to two or more gate structures to each other, and a second output line connecting output wirings connected to two or more active regions to each other, wherein a position of the first input line in the first standard cell region is different from a position of the second input line in the second standard cell region, and a position of the first output line in the first standard cell region is different from a position of the second output line in the second standard cell region.

According to an aspect of the present inventive concepts, a semiconductor device includes a plurality of standard cells in a first direction and a second direction, parallel to an upper surface of a substrate and intersecting with each other, and each of the plurality of standard cells having one or more gate structures and one or more active regions, wherein the plurality of standard cells comprise first standard cells in a first standard cell region and a second standard cell region, defined in different positions in at least one of the first direction or the second direction, and the first standard cells provides the same circuit, wherein the first standard cell in the first standard cell region comprises a first input line connecting two or more gate structures to each other and extending in the second direction, and a first output line connecting two or more active regions to each other and extending in the second direction, and the first standard cell in the second standard cell region comprises a second input line connecting two or more gate structures to each other and extending in the second direction, and a second output line connecting two or more active regions to each other and extending in the second direction, wherein a distance between the first input line and the first output line is different from a distance between the second input line and the second output line, in the first direction.

According to an aspect of the present inventive concepts, a method for a layout of a semiconductor device including a plurality of standard cells, includes disposing two or more standard cells among the plurality of standard cells with reference to a standard cell library; disposing at least one filler cell between the two or more standard cells; determining, in at least one standard cell among the two or more standard cells, a position of an input line connecting two or more gate structures to each other and a position of an output line connecting two or more active regions to each other; and connecting the two or more standard cells to each other to generate the layout.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
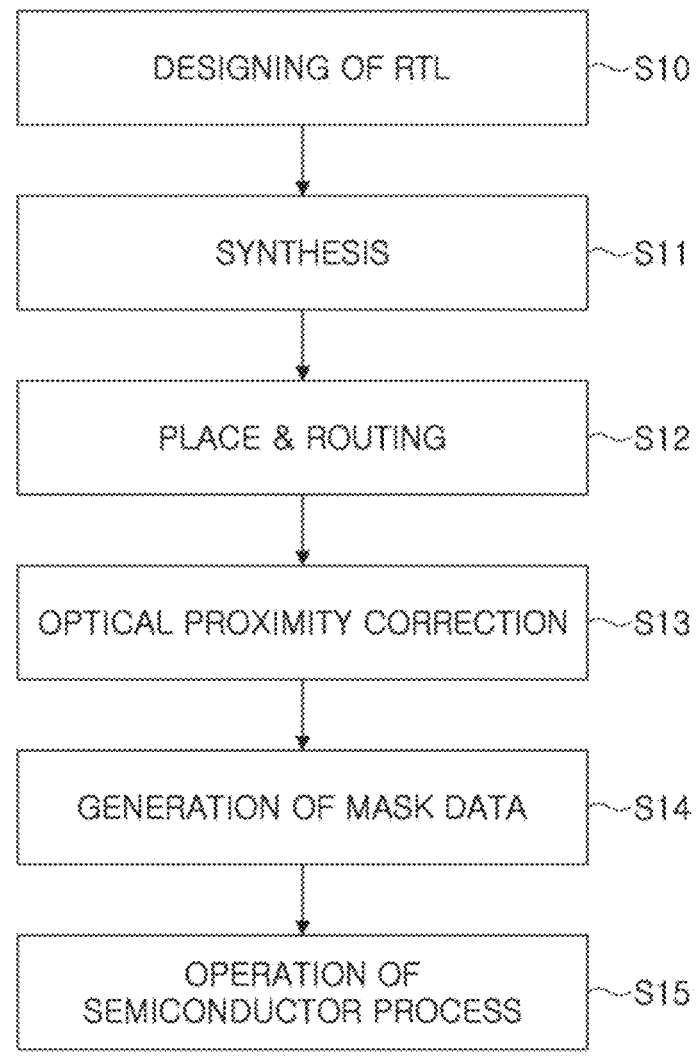
FIG. 1 is a flowchart illustrating a method of manufacturing a semiconductor device according to example embodiments of the present inventive concepts.

FIG. 1 is a flowchart illustrating a method of manufacturing a semiconductor device according to example embodiments of the present inventive concepts.

Referring to FIG. 1, a method of manufacturing a semiconductor device according to example embodiments of the present inventive concepts may start with designing of a register transfer level (RTL) (S10). An RTL code generated by the designing of RTL may define functionality of the semiconductor device. For example, the RTL code may be expressed in a language such as VHSIC hardware description language (VHDL), Verilog, and/or the like.

When the RTL code is generated, logic synthesis for generating net list data of the semiconductor device from the RTL code may be performed using standard cells stored in a predetermined or alternatively, desired library (S11). The net list data may include data defining standard cells and a connection relationship between the standard cells, and may be generated by a predetermined or alternatively, desired semiconductor design tool. The standard cells may provide various circuits such as AND, OR, NOR, inverter, OR-AND-inverter (OAI), AND-OR-inverter (AOI), flip-flop, latch, and/or the like.

Thereafter, a placing & routing operation for generating layout data with reference to the net list data may be performed (S12). The placing and routing operation of S12 may be performed with reference to layout of the standard cells stored in the library. The semiconductor design tool performing the placing and routing operation may generate the layout data including placing information of the standard cells and routing information connecting the placed standard cells, with reference to the library and the net list data in which the standard cells are stored.

When the placing and routing operation is completed, optical proximity correction may be performed on the layout data generated in S12 (S13). When the optical proximity correction is completed, mask data for forming various patterns on a plurality of layers may be generated (S14). After exposure to a photoresist and/or the like is performed using the mask data and a mask is generated, a semiconductor process using the mask may be performed (S15) to manufacture a semiconductor device.

In the placing and routing operation, the standard cells may be disposed in standard cell regions, and empty spaces between the standard cell regions may be allocated as filler cell regions, and may be filled with filler cells. In the routing operation, wiring patterns for connecting semiconductor devices included in the standard cells to each other may be formed.

In general, in each standard cells, positions of at least a portion of wiring patterns for connecting semiconductor devices may be predefined, and for example, wiring patterns necessary for implementing a circuit provided by the standard cells may be predefined. The wiring patterns predefined in the standard cells may include an input line connecting input wirings arranged in different positions and receiving an input signal, and an output line connecting output wirings arranged in different positions and outputting an output signal.

When positions of the input line and the output line are predefined in all of the standard cells, a degree of freedom of design in placing and routing operations may be reduced, performance of the semiconductor device may be deteriorated due to inability to efficiently arrange the wiring patterns, and/or other problems may arise. In example embodiments of the present inventive concepts, in at least one of the standard cells, candidates of positions in which the input line and the output line are arranged may be defined, without defining positions of the input line and the output line in advance. Therefore, a degree of freedom in designing wiring patterns including an input line and an output line in a placing and routing operation may be secured, and the wiring patterns may be more efficiently arranged to improve performance of a semiconductor device.

Figure 2:
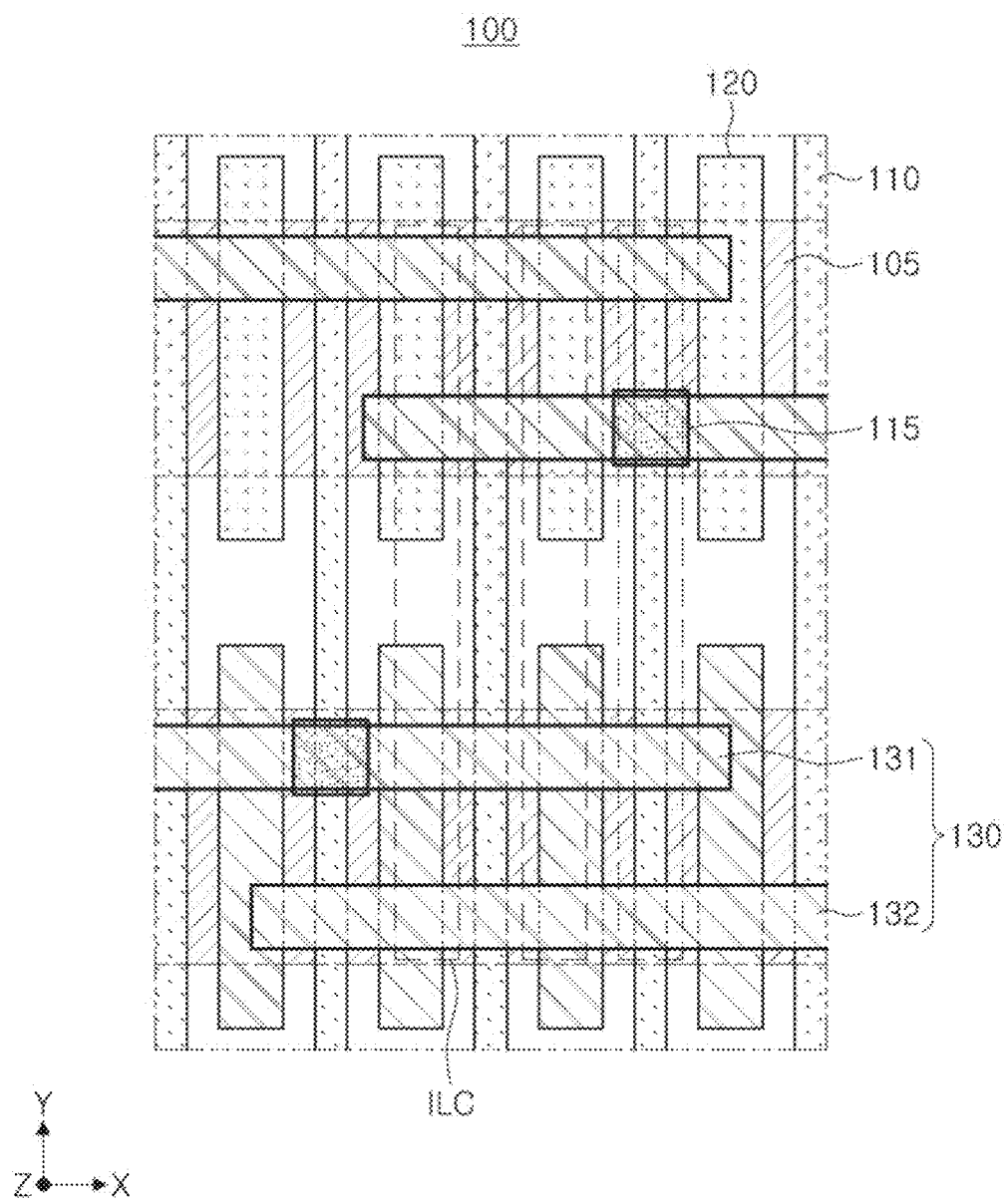
FIGS. 2 and 3 are views illustrating a method of placing an input line and an output line in a standard cell included in a semiconductor device according to example embodiments of the present inventive concepts.
Figure 3:
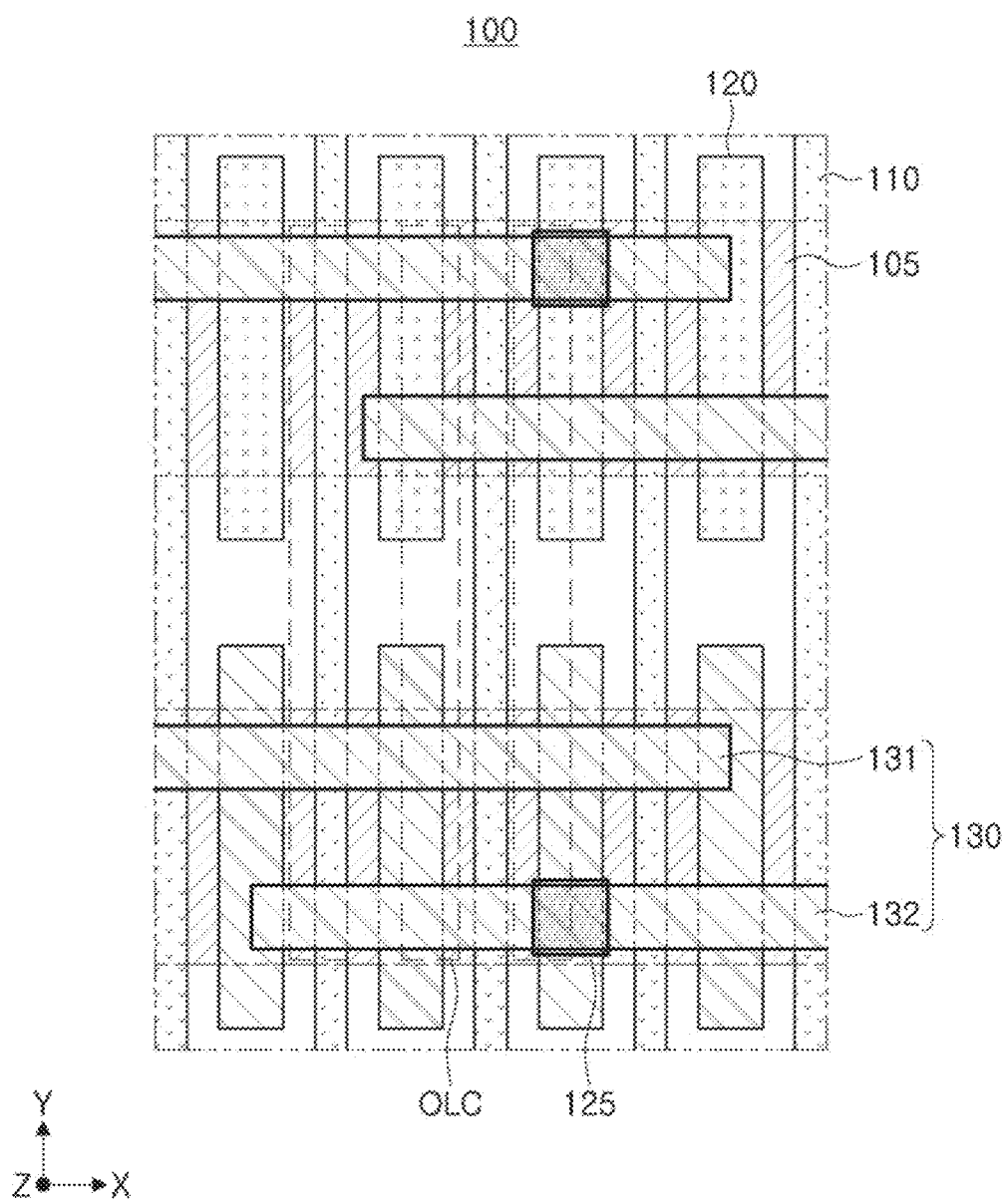

FIGS. 2 and 3 are views illustrating a method of placing an input line and an output line in a standard cell included in a semiconductor device according to example embodiments of the present inventive concepts.

Referring to FIGS. 2 and 3, in a semiconductor device according to example embodiments of the present inventive concepts, a standard cell 100 may include active regions 105 extending in a first direction (an X-axis direction), and gate structures 110 extending in a second direction (a Y-axis direction) and intersecting the active region 105. The active regions 105 and the gate structures 110 may provide a plurality of semiconductor elements. For example, a gate structure among the gate structures 110, and active regions 105 disposed on both sides of the gate structure may provide a transistor. The active regions 105 may be connected to active contacts 120 adjacent to the gate structures 110.

In addition, the standard cell 100 may include lower wiring patterns 130 having input wirings 131 connected to at least one of the gate structures 110 through a gate via 115, and output wirings 132 connected to at least one of the active contacts 120 through an active via 125. The lower wiring patterns 130 may be formed of a conductive material such as metal or metal silicide, and may extend in the first direction as illustrated in FIGS. 2 and 3.

For example, a pair of input wirings 131 disposed in different positions may be connected to each other by an input line extending in the second direction, to commonly input an input signal into the pair of input wirings 131. In addition, a pair of output wirings 132 disposed in different positions may be connected to each other by an output line extending in the second direction, to output an output signal. The input line and the output line may be located above the lower wiring patterns 130 in a third direction (a Z-axis direction), and may be formed of a conductive material such as metal, metal silicide, and/or the like.

In example embodiments illustrated in FIGS. 2 and 3, positions of the input line and the output line in the standard cell 100 may not be predetermined, and candidate positions ILC and OLC in which the input line and the output line are arranged may be only provided. For example, the input line and the output line may have to be arranged with a predetermined or alternatively, desired width and distance according to an arrangement rule of wiring patterns disposed above the lower wiring patterns 130. In addition, the candidate positions ILC and OLC of the input line and the output line may be limited to positions at which the input wirings 131 may be connected to each other and the output wirings 132 may be connected to each other.

Therefore, as illustrated in FIGS. 2 and 3, candidate positions ILC of the input line and candidate positions OLC of the output line may be predefined in the standard cell 100. In a process of designing layout of the semiconductor device using the standard cell 100, positions, the number, and/or the like of wiring patterns connecting the standard cell 100 to other standard cells may be taken into consideration, positions of the input line and the output line in the candidate positions ILC and OLC may be selected, respectively.

Figure 4:
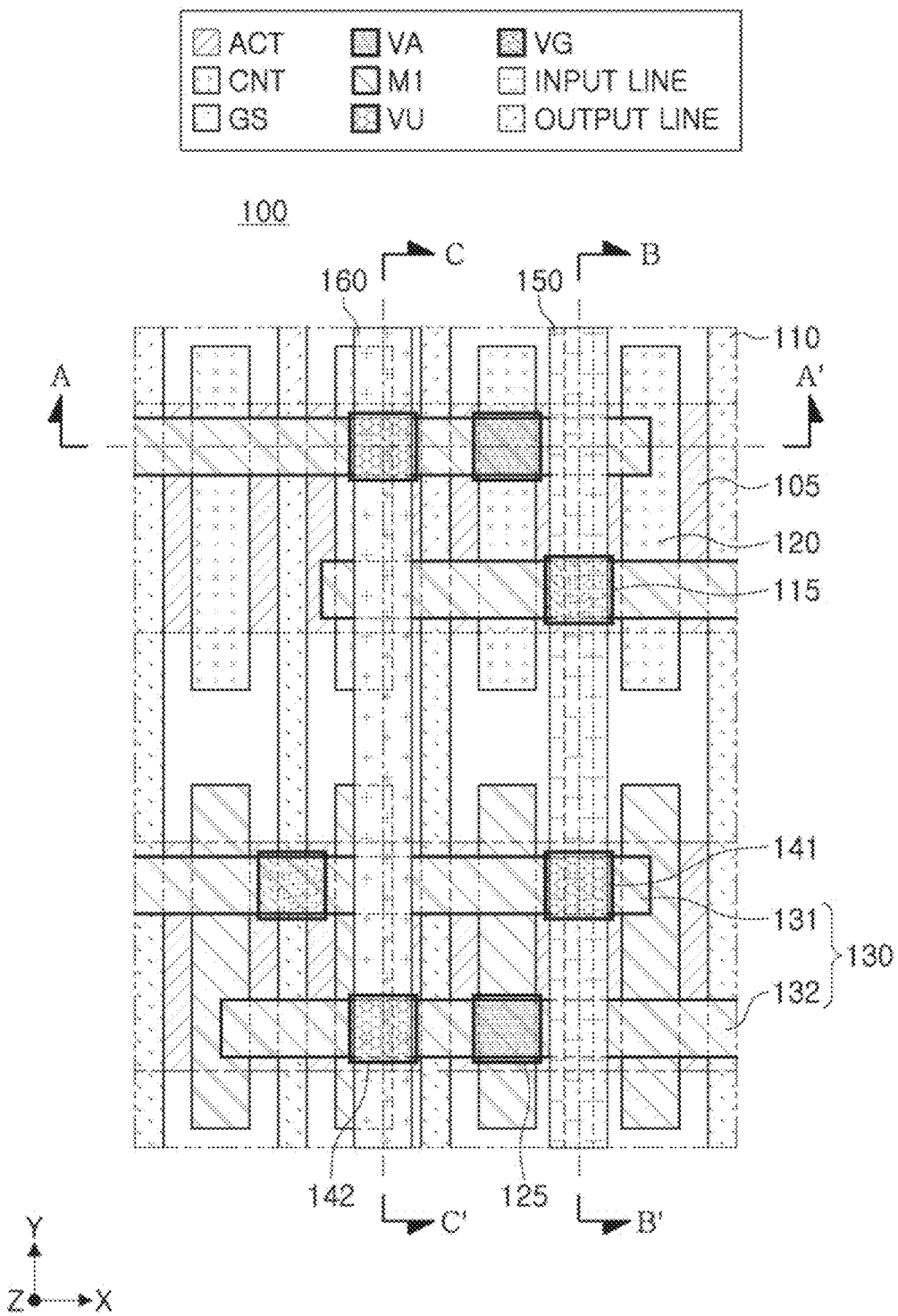
FIG. 4 is a plan view schematically illustrating a standard cell included in a semiconductor device according to example embodiments of the present inventive concepts.

FIG. 4 is a plan view schematically illustrating a standard cell included in a semiconductor device according to example embodiments of the present inventive concepts.

Referring to FIG. 4, in the standard cell 100 according to example embodiments described above with reference to FIGS. 2 and 3, a position of an input line 150 and a position of an output line 160 may be determined. In example embodiments illustrated in FIG. 4, the input line 150 may be disposed in a rightmost candidate position among the candidate positions ILC illustrated in FIG. 2, and the output line 160 may be disposed on a central candidate position among the candidate positions OLC illustrated in FIG. 3. In example embodiments, a width of the input line 150 and a width of the output line 160 in the first direction may be greater than a width of each of the gate structures 130, respectively.

The input line 150 may connect a pair of input wirings 131 separated from each other in the second direction (the Y-axis direction) through a pair of lower input vias 141. The output line 160 may connect a pair of output wirings 132 separated from each other in the second direction through a pair of lower output vias 142. Therefore, an input signal may be commonly input to the pair of input wirings 131 through the input line 150, and an output signal to be emitted in common may be output to the pair of output wirings 132 through the output line 160.

The input wirings 131 connected to each other by the input line 150 may be connected to two or more gate structures 110, by gate vias 115. The gate vias 115 electrically connected to the input line 150 may be disposed in different positions in the first direction, and thus may be connected to different gate structures 110.

Similarly, output wirings 132 connected to each other by output line 160 may be connected to two or more active contacts 120 through active vias 125. Referring to FIG. 4, the active contacts 120 connected to the output line 160 may be doped with impurities of different conductivity types.

According to example embodiments, metal wirings may be also formed in remaining candidate positions ILC and OLC, where the input line 150 and the output line 160 are not formed. The metal wirings formed in the remaining candidate positions ILC and OLC may be formed to have the same width as the input line 150 and the output line 160.

Hereinafter, a structure of the standard cell 100 included in the semiconductor device according to example embodiments of the present inventive concepts will be described in more detail with reference to FIGS. 5 to 7.

Figure 5:
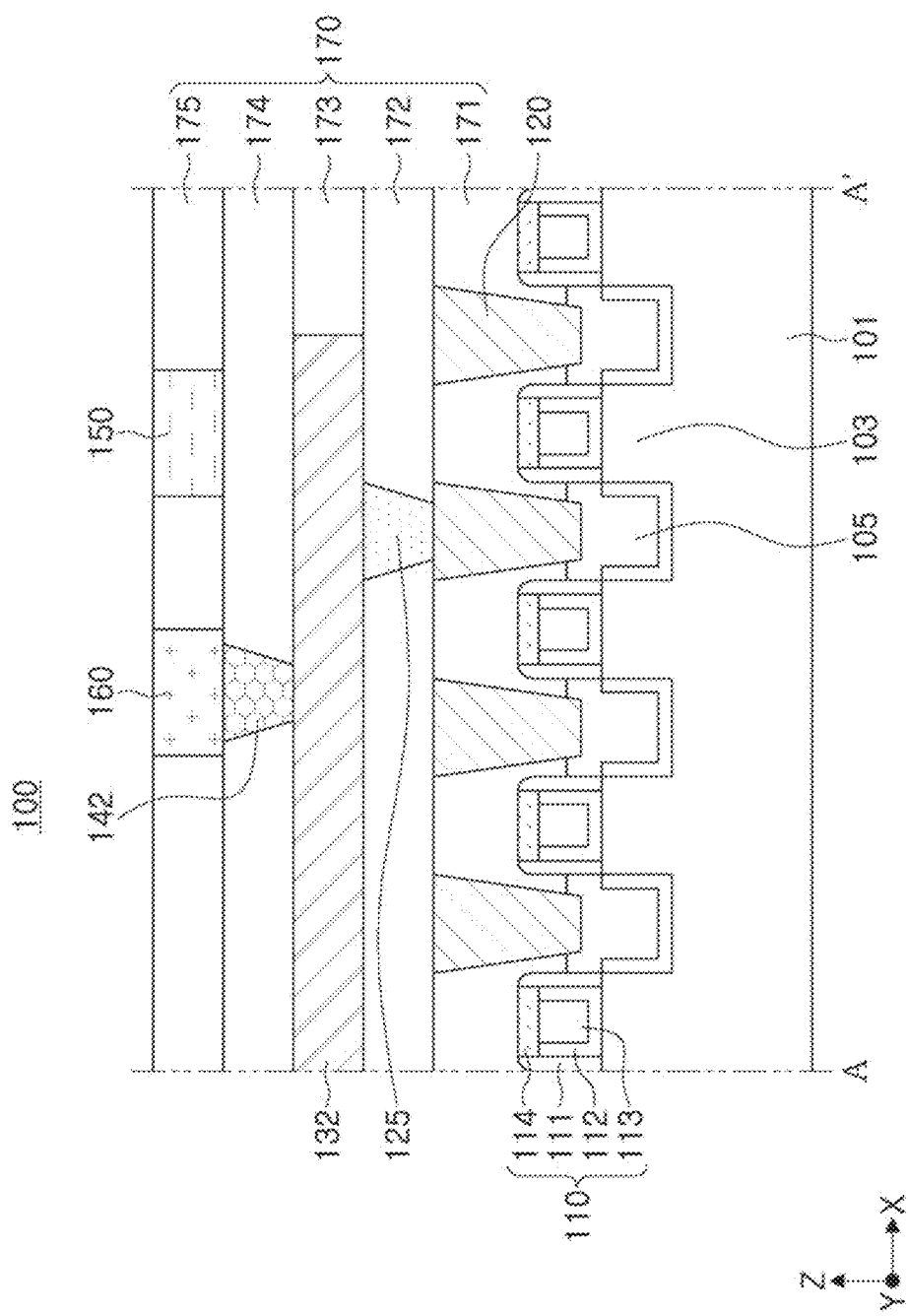
FIG. 5 is a cross-sectional view of FIG. 4, taken along line A-A'.
Figure 6:
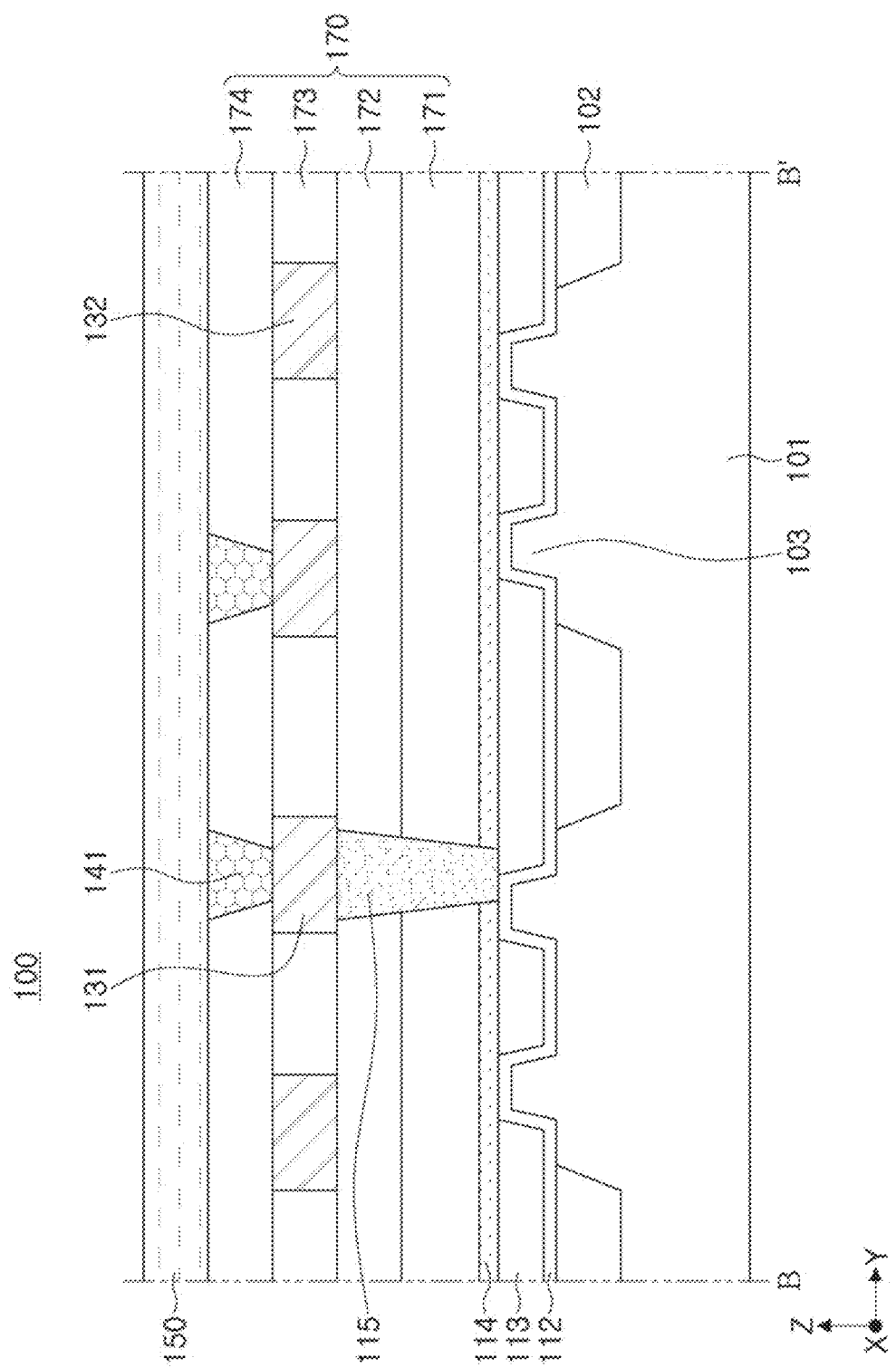
FIG. 6 is a cross-sectional view of FIG. 4, taken along line B-B'.
Figure 7:
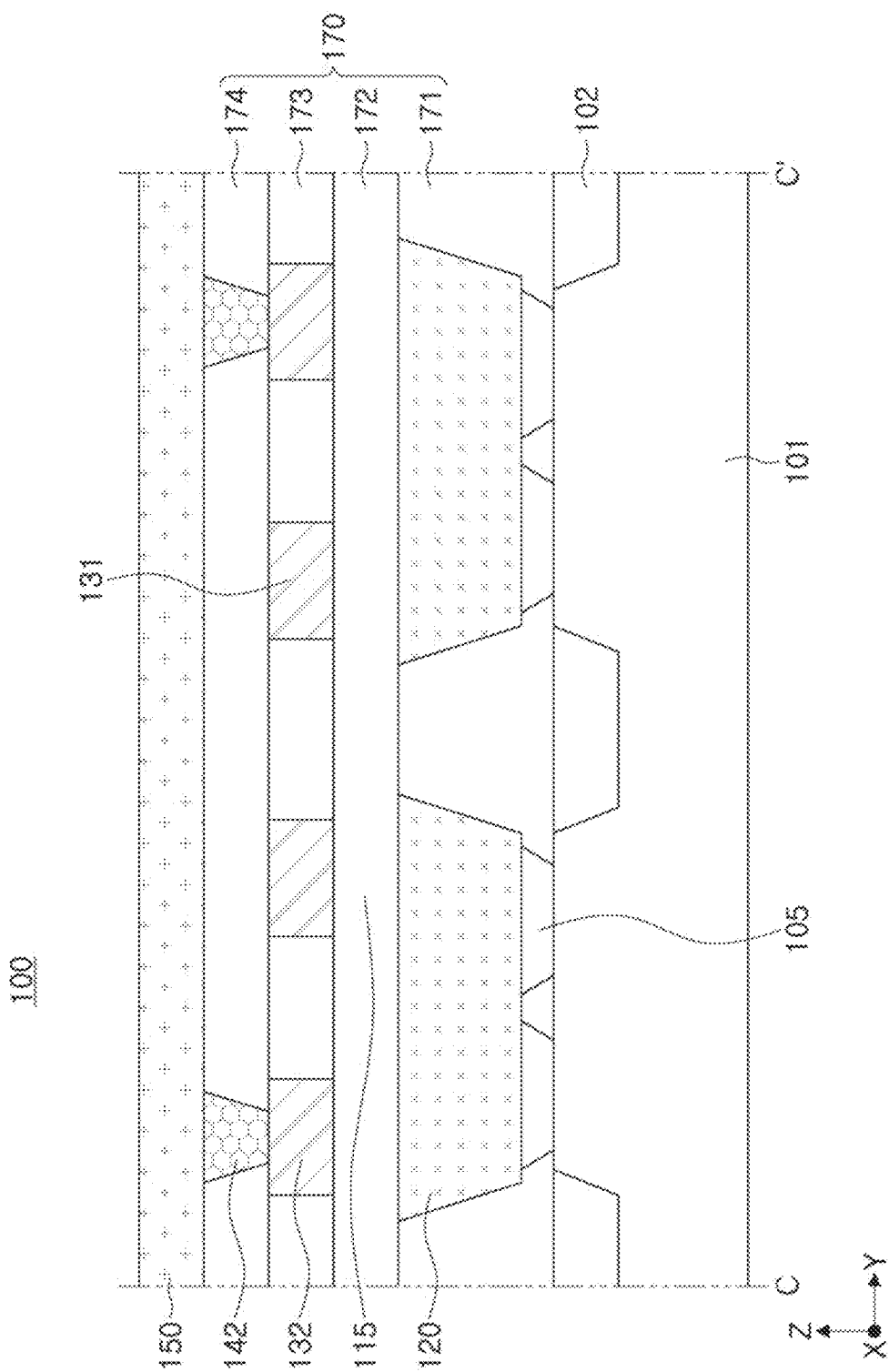
FIG. 7 is a cross-sectional view of FIG. 4, taken along line C-C'.

FIG. 5 is a cross-sectional view of FIG. 4, taken along line A-A', FIG. 6 is a cross-sectional view of FIG. 4, taken along line B-B', and FIG. 7 is a cross-sectional view of FIG. 4, taken along line C-C'.

Referring to FIGS. 5 to 7, the standard cell 100 according to example embodiments of the present inventive concepts may include the active regions 105 formed on a semiconductor substrate 101, the gate structures 110 disposed between the active regions 105, the active contacts 120 connected to the active regions 105, and/or the like. A channel region 103 may be defined between active regions 105 adjacent to each other in the first direction (the X-axis direction), and at least one of the gate structures 110 may be disposed on the channel region 103.

In example embodiments described with reference to FIGS. 5 to 7, it is assumed that a channel region of each of the semiconductor elements of the standard cell 100 may be implemented as fin structures. Unlike this, the channel region may be formed on the semiconductor substrate 101, and may be implemented as a nanowire, a nanosheet, and/or the like, surrounded by the gate structures 110. Alternatively, the channel region of each of the semiconductor elements may be implemented in an upper surface of the semiconductor substrate 101, not a structure in which the channel region protrudes in the third direction (the Z-axis direction). For example, each of the semiconductor elements may be implemented as a general horizontal transistor.

Referring to FIG. 5, each of the gate structures 110 may include a gate spacer 111, a gate insulating layer 112, a gate conductive layer 113, a capping layer 114, and/or the like. A structure of each of the gate structures 110 may be variously modified according to example embodiments. For example, a thickness or/and a material of the gate insulating layer 112 may be changed in consideration of a threshold voltage and/or the like of each of the semiconductor elements, or a material or/and a stack structure of the gate conductive layer 113 may be changed.

The active contacts 120 may be adjacent to the gate structures 110 in the first direction (the X-axis direction), and may be connected to the active regions 105. The active contacts 120 may be formed of metal, metal silicide, polysilicon, and/or the like, and may include two or more layers formed of different materials. For example, each of the active contacts 120 may include a metal silicide layer directly contacting the active regions 105, and a metal layer disposed on the metal silicide layer.

At least one of the active contacts 120 may be connected to one of the output wirings 132 through the active via 125 disposed thereon. The active via 125 and the output wirings 132 may also include a plurality of layers, for example, a barrier metal layer and a fill metal layer. In some example embodiments, the output wirings 132 and the active via 125 may be formed by a single process. In some example embodiments, the barrier metal layers of the output wirings 132 and the active via 125 may be connected to be provided as a single layer.

The output wirings 132 may be connected to the output line 160 through one of the lower output vias 142 thereon. The output line 160 may be disposed on the same height as the input line 150. For example, a layer on which the lower wiring patterns 130 are disposed may be defined as a first wiring layer, and a layer on which the input line 150 and the output line 160 are disposed may be defined as a second wiring layer.

In example embodiments, positions of the lower wiring patterns 130 disposed in the first wiring layer may be predefined in the standard cell 100. A position of at least a portion of the wiring patterns disposed on the second wiring layer, for example, positions of the input line 150 and the output line 160 may not be predefined in the standard cell 100, and, during the placing and routing operation, the positions of the input line 150 and the output line 160 may be selected from among candidate positions defined in the standard cell 100, respectively.

The standard cell 100 may include an interlayer insulating layer 170, and the interlayer insulating layer 170 may include a plurality of interlayer insulating layers 171 to 175. For example, a first interlayer insulating layer 171 may be disposed on the same height as the gate structures 110 and the active contacts 120, and a second interlayer insulating layer 172 may be disposed on the same height as the active via 125 and the gate via 115. A third interlayer insulating layer 173 may be disposed on the same height as the first wiring layer, a fourth interlayer insulating layer 174 may be disposed on the same height as the lower vias 141 and 142, and a fifth interlayer insulating layer 175 may be disposed on the same height as the lower vias 141 and 142. The interlayer insulating layer 170 may be formed of silicon oxide, silicon nitride, silicon oxynitride, and/or the like.

Referring to FIG. 6, the semiconductor elements may be separated in the standard cell 100 by an element isolation layer 102 formed on the semiconductor substrate 101. For example, the semiconductor elements disposed on both sides of the element isolation layer 102 in the second direction (the Y-axis direction) may be a PMOS element and an NMOS element, respectively.

The channel region 103 may be provided by fin structures extending in the third direction, perpendicular to the upper surface of the semiconductor substrate 101, and among the gate structures 110, the gate insulating layer 112 may have a shape wrapping upwardly over the fin structures. For example, both side and upper surfaces of the fin structures may be in contact with the gate insulating layer 112. Referring to FIG. 6, the gate insulating layer 112 may be in contact with the side and upper surfaces of the fin structures, and the gate conductive layer 113 and the capping layer 114 may be formed on the gate insulating layer 112.

The gate via 115 may be connected to the gate conductive layer 113, and may pass through, for example, the first interlayer insulating layer 171 and the second interlayer insulating layer 172. A lower surface of the gate via 115 may be in contact with the gate conductive layer 113, and an upper surface of the gate via 115 may be disposed on a position higher than upper surfaces of the active contacts 120. For example, the upper surface of the gate via 115 may be disposed on the same height as an upper surface of the second interlayer insulating layer 172.

The gate via 115 may be connected to at least one of the input wirings 131 extending from the first wiring layer in the first direction. The input wirings 131 may be connected to the input line 150 extending from the second wiring layer in the second direction by the input vias 141. Therefore, as illustrated in FIG. 6, two or more input wirings 131 may be connected to each other by an input line 150.

According to example embodiments, two or more gate vias 115 disposed in different positions in the second direction may be connected to at least one of the gate structures 110 electrically connected to each other by the input line 150. For example, in example embodiments illustrated in FIG. 6, each of the input wirings 131 may be connected to the gate conductive layer 113 by a gate via 115. In some example embodiments, the input wirings 131 may be electrically connected to each other by the input line 150 in an upper portion in the third direction, and may be electrically connected to each other by the gate conductive layer 113 in a lower portion in the third direction.

Referring to FIG. 7, as described above with reference to FIG. 6, semiconductor elements may be separated in the standard cell 100 by the element isolation layer 102 formed on the semiconductor substrate 101. For example, the semiconductor elements disposed on both sides of the element isolation layer 102 in the second direction may be a PMOS element and an NMOS element, respectively. Therefore, the active regions 105 disposed on one side of the element isolation layer 102, and the active regions 105 disposed on the other side of the element isolation layer 102 may be doped with impurities of different conductivity types.

As described above with reference to FIG. 5, the active regions 105 may be connected to the channel region 103 in the first direction. For example, the active regions 105 may be formed by applying a selective epitaxial growth process to the semiconductor substrate 101. The active regions 105 may be connected to the active contacts 120, and for example, the active contacts 120 may be formed to recess a portion of the active regions 105. The active regions 105 physically separated from each other in the second direction may be electrically connected to each other by each of the active contacts 120.

Referring to FIG. 7, the upper surfaces of the active contacts 120 may be disposed on the same height as an upper surface of the first interlayer insulating layer 171. Therefore, lower surfaces of the active contacts 120 may be located between upper surfaces of the gate structures 110 and upper surfaces of the gate vias 115 in the third direction. This is only illustrative, and in other example embodiments, arrangement and heights of the active contacts 120, the gate structures 110, and the gate via 115 may be variously modified.

As described above with reference to FIG. 4, the active contacts 120 may be connected to the output lines 132 of the first wiring layer by active vias 125. Referring to FIG. 7, the output wirings 132 may be connected to an output line 160 through the output vias 142 thereon. Therefore, two or more output wirings 132 may be electrically connected to each other by an output line 160.

Figure 8:
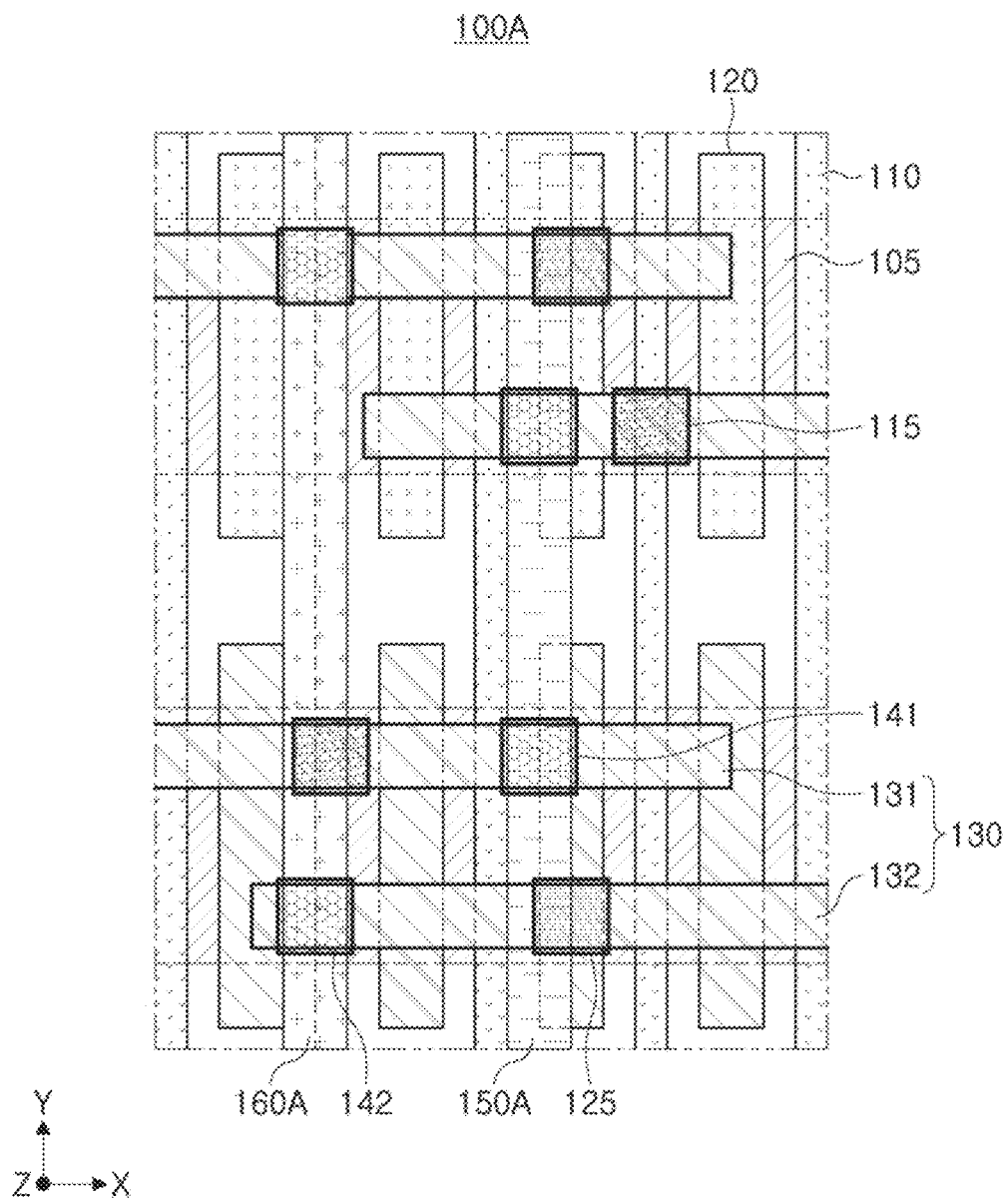
FIG. 8 is a plan view schematically illustrating a standard cell included in a semiconductor device according to example embodiments of the present inventive concepts.

FIG. 8 is a plan view schematically illustrating a standard cell included in a semiconductor device according to example embodiments of the present inventive concepts.

A standard cell 100A according to example embodiments illustrated in FIG. 8 may provide the same circuit as the standard cell 100 according to example embodiments described above with reference to FIGS. 2 to 7. A position of an input line 150A and a position of an output line 160A, included in the standard cell 100A, may be selected differently from the standard cell 100 according to example embodiments described with reference to FIG. 4 above. In example embodiments illustrated in FIG. 8, the input line 150A may be disposed on a central candidate position among the candidate positions ILC illustrated in FIG. 2, and the output line 160A may be disposed on a leftmost candidate position among the candidate positions OLC illustrated in FIG. 3.

The standard cell 100 described with reference to FIG. 4 and the standard cell 100A described with reference to FIG. 8 may be included in a single semiconductor device. The standard cells 100 and 100A may be disposed in different positions in a semiconductor device. For example, the standard cell 100 described with reference to FIG. 4 may be disposed in a first standard cell region, and the standard cell 100A described with reference to FIG. 8 may be disposed in a second standard cell region on a position, different from the first standard cell region.

Therefore, in each of the standard cells 100 and 100A providing the same circuit, positions of the input lines 150 and 150A may be different from each other, or positions of the output lines 160 and 160A may be different from each other. In a design process in which the standard cells 100 and 100A are arranged and connected to each other, the positions of the input lines 150 and 150A and the positions of the output lines 160 and 160A may be selected from the plurality of candidate positions ILC and OLC, as needed. Therefore, a degree of design freedom may increase and resistance and parasitic capacitance may decrease by efficiently arranging wiring patterns, to improve performance of a semiconductor device.

Figure 9:
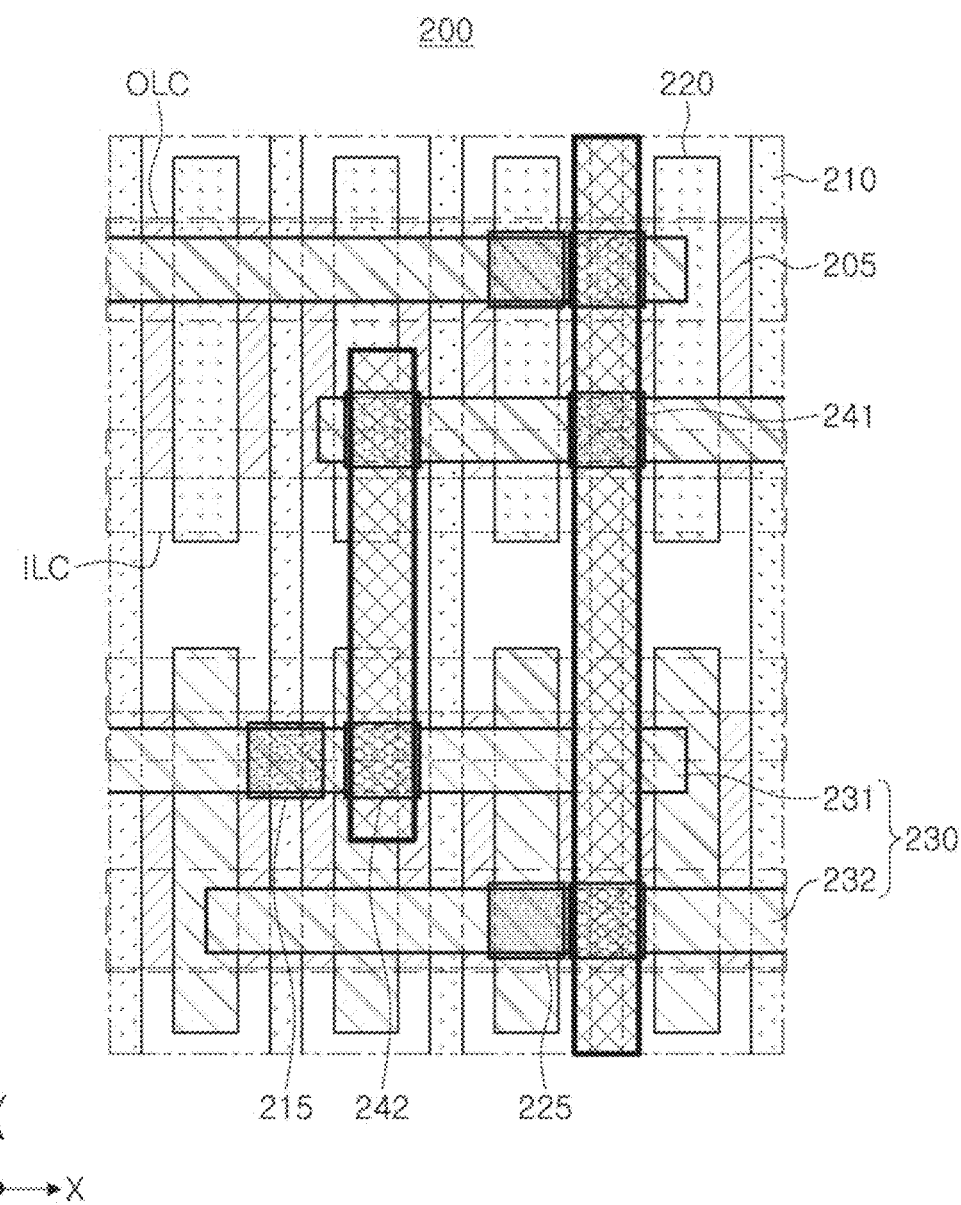
FIG. 9 is a view illustrating a method of placing an input line and an output line in a standard cell included in a semiconductor device according to example embodiments of the present inventive concepts.

FIG. 9 is a view illustrating a method of placing an input line and an output line in a standard cell included in a semiconductor device according to example embodiments of the present inventive concepts.

Referring to FIG. 9, in a semiconductor device according to example embodiments of the present inventive concepts, a standard cell 200 may include active regions 205 extending in the first direction (the X-axis direction), gate structures 210 extending in the second direction (the Y-axis direction) and intersecting the active regions 205, active contacts 220 connected to the active regions 205, and/or the like. The active regions 205 and the gate structures 210 may provide a plurality of semiconductor elements.

Also, the standard cell 200 may include a first wiring layer and a second wiring layer disposed above the active contacts 220 in the third direction (the Z-axis direction). Lower wiring patterns 230 may be disposed on the first wiring layer. For example, input wirings 231 connected to the gate structures 210, and output wirings 232 connected to the active contacts 220 may be arranged. The lower wiring patterns 230 may extend in the first direction.

Intermediate wiring patterns 240 extending in the second direction may be disposed on the second wiring layer. One of the intermediate wiring patterns 240 may connect two or more input wirings 231 to each other through lower input vias 241, and the other of the intermediate wiring patterns 240 may connect two or more output wirings 232 to each other through lower output vias 242.

In example embodiments illustrated in FIG. 9, the input line and the output line may be disposed in a third wiring layer, located above the second wiring layer. Referring to FIG. 9, candidate positions ILC and OLC in which an input line and an output line are disposed may be provided in the standard cell 200, and the candidate positions ILC and OLC may be defined in different positions in the second direction. Therefore, when two or more standard cells 200 are disposed in different first and second standard cell regions in a semiconductor device, an input line of the standard cell 200 disposed in the first standard cell region and an input line of the standard cell 200 disposed in the second standard cell region may be disposed in different positions in the second direction. Alternatively, an output line of the standard cell 200 disposed in the first standard cell region and an output line of the standard cell 200 disposed in the second standard cell region may be disposed in different positions in the second direction.

Figure 10:
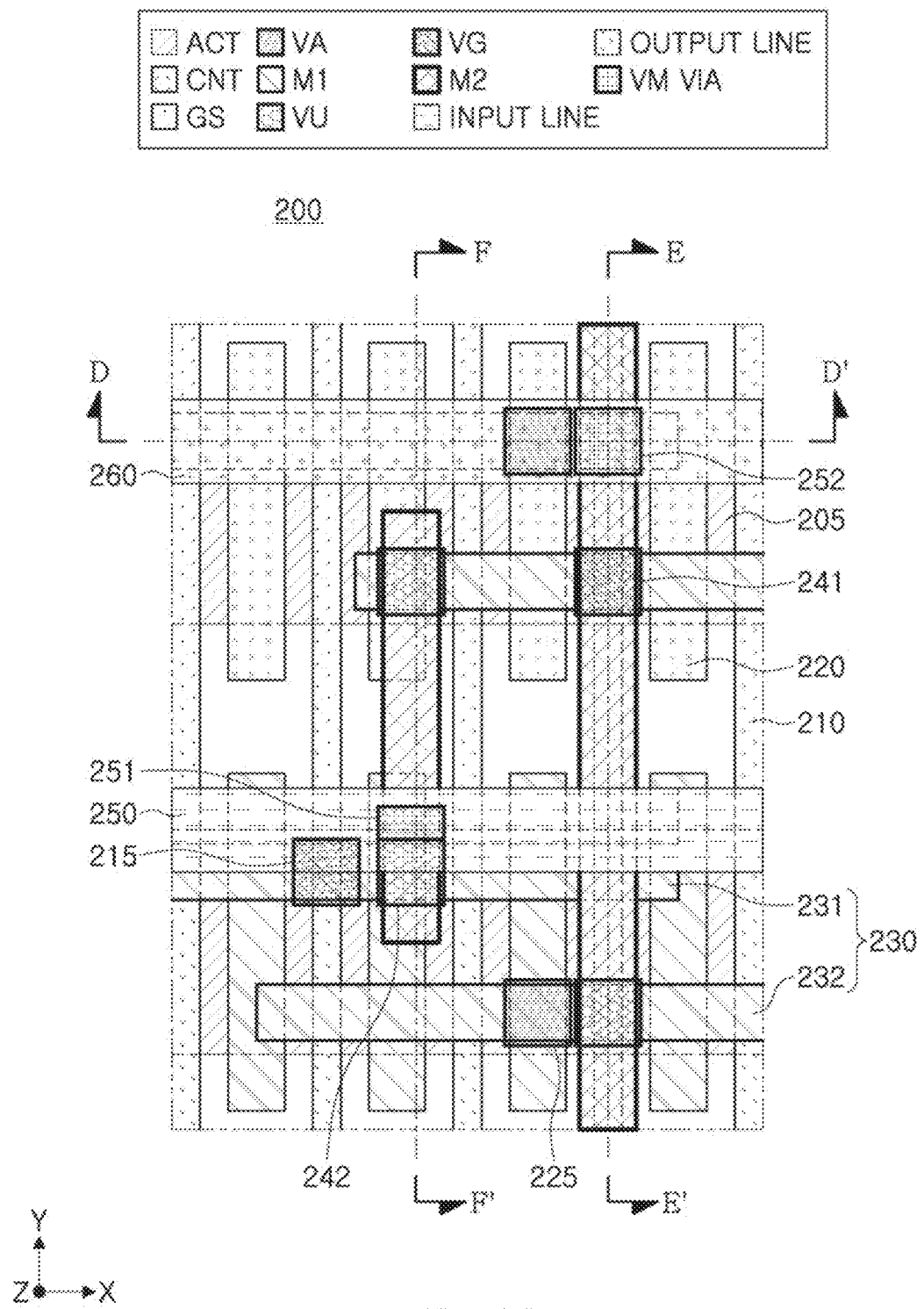
FIG. 10 is a plan view schematically illustrating a standard cell included in a semiconductor device according to example embodiments of the present inventive concepts.

FIG. 10 is a plan view schematically illustrating a standard cell included in a semiconductor device according to example embodiments of the present inventive concepts.

Referring to FIG. 10, a position of an input line 250 and a position of an output line 260 may be determined from among the candidate positions ILC and OLC described above with reference to FIG. 9, respectively. The input line 250 may be connected to an intermediate wiring pattern connected to two or more input wirings 231 among intermediate wiring patterns 240 through an upper input via 251. The output line 260 may be connected to another intermediate wiring pattern connected to two or more output wirings 232 among the intermediate wiring patterns 240 through an upper output via 252.

Hereinafter, a structure of a standard cell 200 included in the semiconductor device according to example embodiments of the present inventive concepts will be described in more detail with reference to FIGS. 11 to 13.

Figure 11:
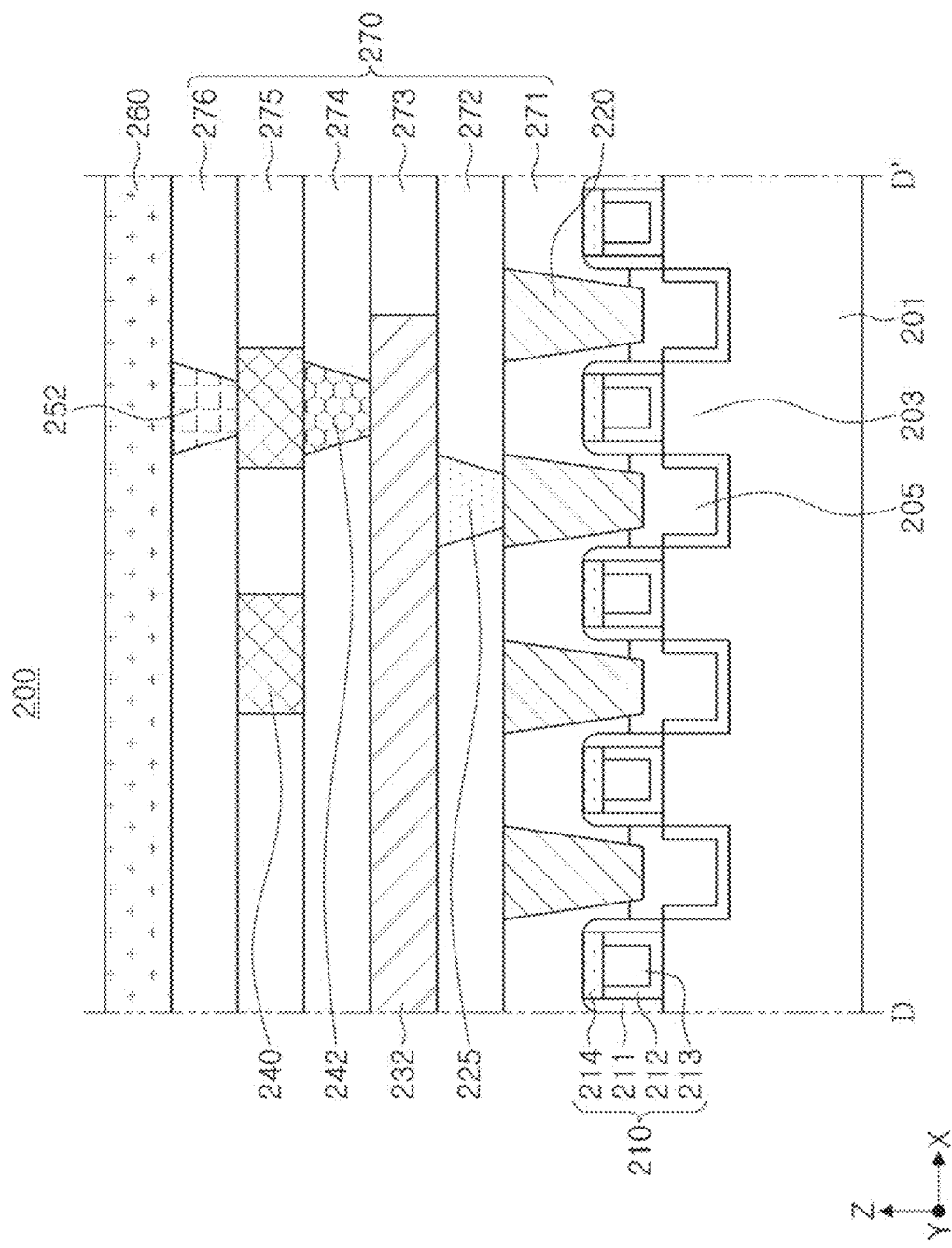
FIG. 11 is a cross-sectional view of FIG. 10, taken along line D-D'.
Figure 12:
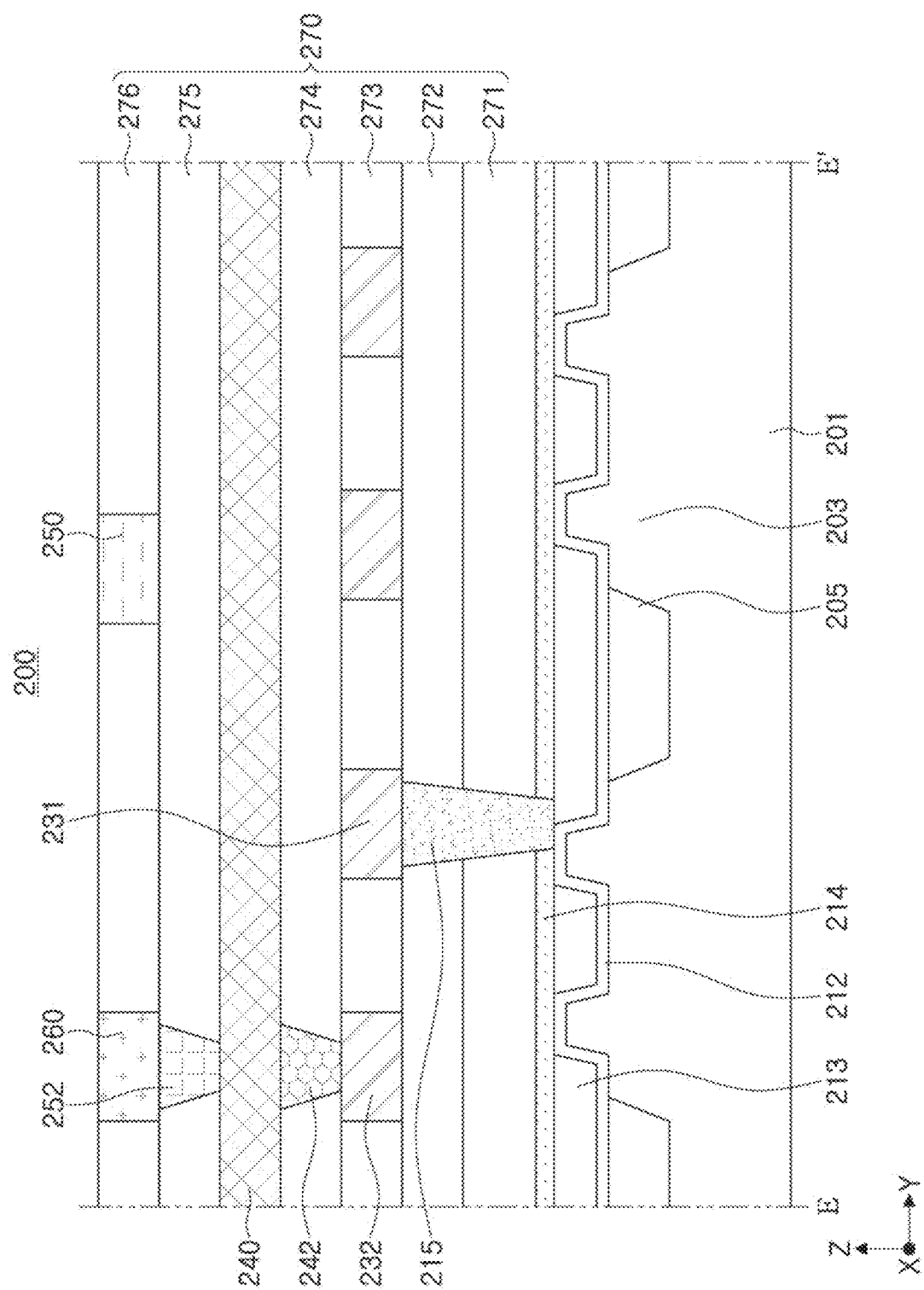
FIG. 12 is a cross-sectional view of FIG. 10, taken along line E-E'.
Figure 13:
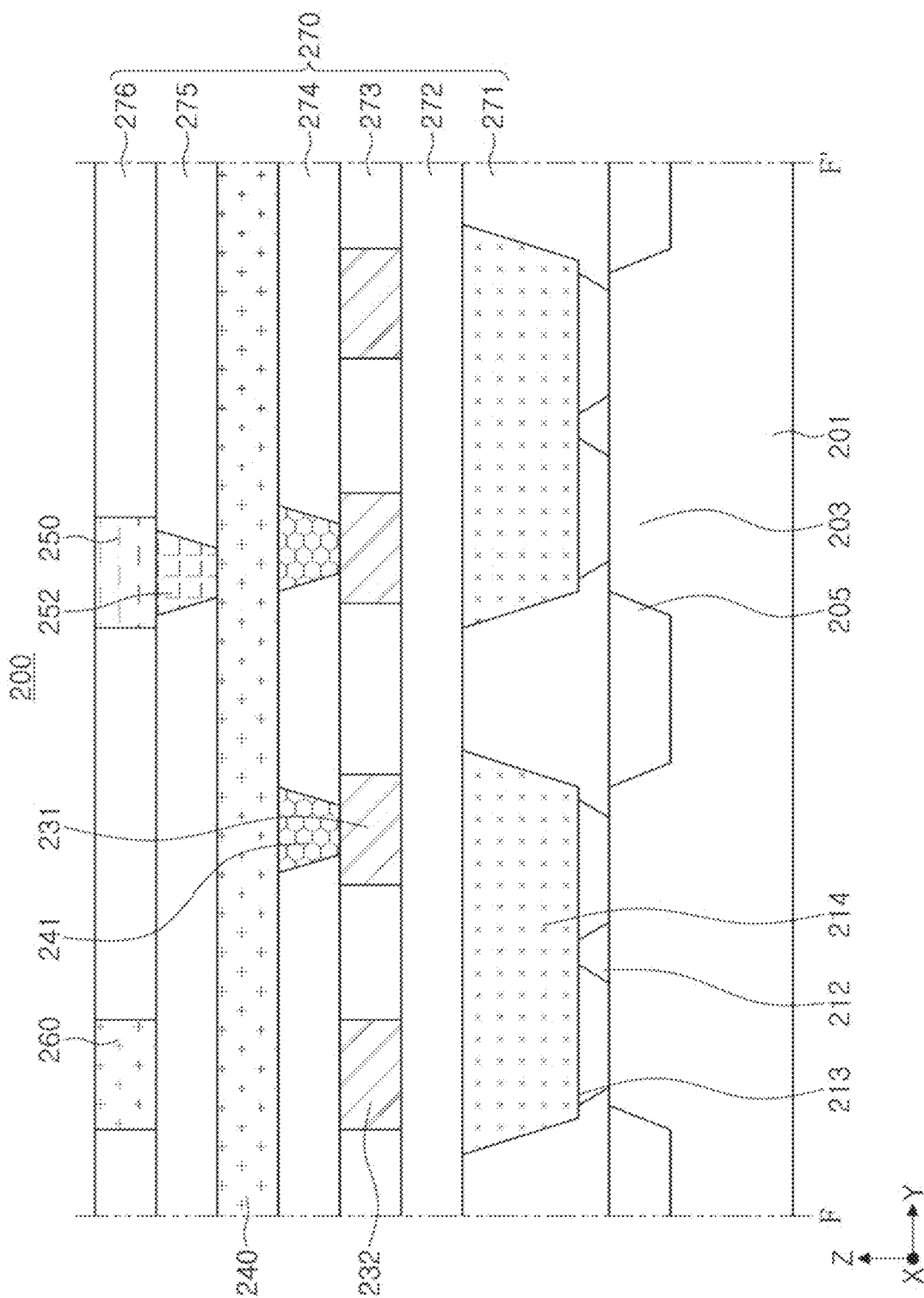
FIG. 13 is a cross-sectional view of FIG. 10, taken along line F-F'.

FIG. 11 is a cross-sectional view of FIG. 10, taken along line D-D', FIG. 12 is a cross-sectional view of FIG. 10, taken along line E-E', and FIG. 13 is a cross-sectional view of FIG. 10, taken along line F-F'.

Referring to FIGS. 11 to 14, the standard cell 200 according to example embodiments of the present inventive concepts may include active regions 205 formed on a semiconductor substrate 201, gate structures 210 disposed between the active regions 205, active contacts 220 connected to active regions 205, and/or the like. A channel region 203 may be defined between the active regions 205 adjacent to each other in the first direction (the X-axis direction), and at least one of the gate structures 210 may be disposed on the channel region 203.

A plurality of wiring layers may be disposed on the gate structures 210, the active regions 205, and the active contacts 220, and the plurality of wiring layers may be formed in an interlayer insulating layer 270. The interlayer insulating layer 270 may include a plurality of interlayer insulating layers 271 to 277, and a structure of the interlayer insulating layer 270 may be similar to that described above with reference to FIGS. 5 to 7.

Referring to FIG. 11, each of the gate structures 210 may include a gate spacer 211, a gate insulating layer 212, a gate conductive layer 213, and a capping layer 214. A structure of each of the gate structures 210 may be variously modified according to example embodiments. The active contacts 220 may be adjacent to the gate structures 210 in the first direction (the X-axis direction), and may be connected to the active regions 205.

At least one of the active contacts 220 may be connected to one of the output wirings 232 through an active via 225 disposed thereon. In some example embodiments, the active via 225 and the output wirings 232 may also include a plurality of layers. The output wirings 232 may extend in the first direction and may be connected to at least one of intermediate wiring patterns 240 through at least one of lower output vias 242 thereon. For example, a layer in which the lower wiring patterns 230 are disposed may be defined as a first wiring layer, and a layer in which the input line 250 and the output line 260 are disposed may be defined as a second wiring layer.

In example embodiments, positions of the lower wiring patterns 230 disposed on the first wiring layer and positions of the intermediate wiring patterns 240 disposed on the second wiring layer may be predefined in the standard cell 200. A position of the input line 250 and a position of the output line 260, disposed on the intermediate wiring patterns 240, may not be defined in the standard cell 200. The input line 250 and the output line 260 may be disposed in a third wiring layer, disposed above the second wiring layer. During a placing and routing operation, the positions of the input line 250 and the output line 260 may be selected from candidate positions defined in the third wiring layer of the standard cell 200, respectively.

Referring to FIG. 11, an output line 260 of which position is determined in the third wiring layer may be connected to at least one of the intermediate wiring patterns 240 through the upper output via 252 during a placing and routing operation. The output line 260 may be connected to at least one active region 205 among the semiconductor devices of 200 through the upper output via 252, the lower output vias 242, the output wirings 232, the active via 225, and the active contacts 220.

Next, referring to FIGS. 12 and 13, semiconductor elements may be separated in the standard cell 200 by an element isolation layer 202 formed on the semiconductor substrate 201. For example, the semiconductor elements disposed on both sides of the element isolation layer 202 in the second direction (the Y-axis direction) may be a PMOS element and an NMOS element, respectively. For example, active regions 205 disposed on one side of the element isolation layer 202 may be doped with impurities of a first conductivity type, and active regions 205 disposed on the other side of the element isolation layer 202 may be doped with impurities of a second conductivity type, different from the first conductivity type.

In example embodiments illustrated in FIG. 12, the channel region 203 may be provided by fin structures, and the gate insulating layer 212 of the gate structures 210 may have a shape wrapping upwardly over the fin structures. For example, both side and upper surfaces of the fin structures may be in contact with the gate insulating layer 212. Referring to FIG. 12, the gate insulating layer 212 may be in contact with the side and upper surfaces of the fin structures, and the gate conductive layer 213 and the capping layer 214 may be formed on the gate insulating layer 212.

The active regions 205 may be connected to the channel region 203 in the first direction. Referring to FIG. 13, the active regions 205 may be connected to the active contacts 220, and for example, the active contacts 220 may be formed to recess a portion of the active regions 205. The active regions 205 physically separated from each other in the second direction may be electrically connected to each other by each of the active contacts 220.

The gate via 215 may pass through a first interlayer insulating layer 271 and a second interlayer insulating layer 272, and may be connected to the gate conductive layer 213. For example, an upper surface of the gate via 215 may be disposed on the same height as an upper surface of the second interlayer insulating layer 272. Referring to FIG. 13, upper surfaces of the active contacts 220 may be disposed on the same height as an upper surface of the first interlayer insulating layer 271. Therefore, the upper surfaces of the active contacts 220 may be located between upper surfaces of the gate structures 210 and the upper surface of the gate via 215 in the third direction. This is only illustrative, and in other example embodiments, arrangement and heights of the active contacts 220, the gate structures 210, and the gate via 215 may be variously modified.

The gate via 215 may be connected to at least one of the input wirings 231 extending from the first wiring layer in the first direction. The input wirings 231 may be disposed in the first wiring layer, together with the output wirings 232, and may be connected to at least one of the intermediate wiring patterns 240 extending from the second wiring layer in the second direction by the lower input via 241. At least one intermediate wiring pattern 240 electrically connected to the gate via 215 by the input wirings 231 may be connected to the input line 250 through the upper input via 251 as illustrated in FIG. 13. Therefore, an input signal transmitted through the input line 250 may be commonly input to the two or more gate structures 210 through the plurality of input lines 231.

At least one of the active contacts 220 may be connected to at least one of the output wirings 232 through the active via 225. The output wirings 232 may be connected to at least one of the intermediate wiring patterns 240 through the lower output vias 242, and may be electrically connected to the output line 260 by the upper output via 252.

Figure 14:
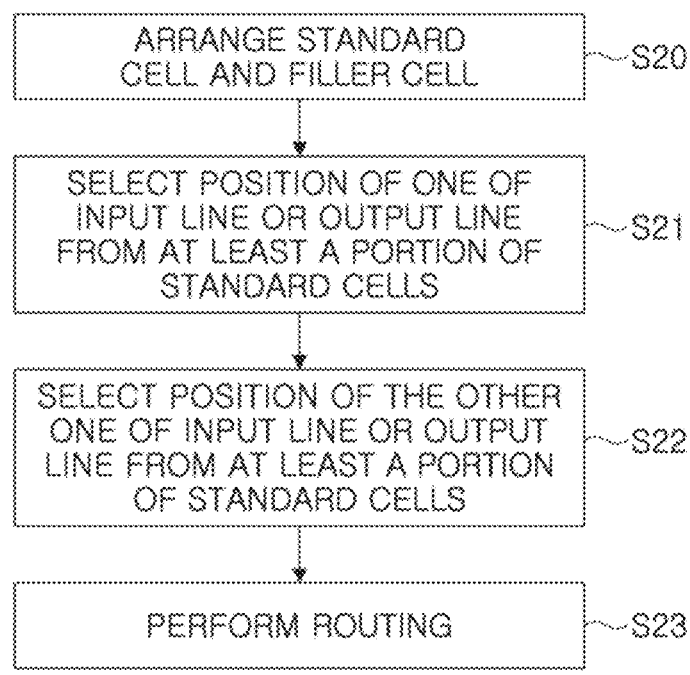
FIG. 14 is a flowchart illustrating a layout method of a semiconductor device according to example embodiments of the present inventive concepts.

FIG. 14 is a flowchart illustrating a layout method of a semiconductor device according to example embodiments of the present inventive concepts.

Referring to FIG. 14, a layout method of a semiconductor device according to example embodiments of the present inventive concepts may start with arrangement of standard cells and filler cells (S20). For example, standard cells may be disposed in standard cell regions, and filler cells may be disposed in filler cell regions.

When the standard cells and the filler cells are arranged, a position of one of an input line or an output line may be selected from at least a portion of the standard cells (S21). In a portion of the standard cells, the input line and the output line may be disposed at predetermined or alternatively, desired positions. In the other portion of the standard cells, positions of the input line and the output line may not be fixed. For example, in at least a portion of the standard cells, positions of the input line and the output line may not be fixed, and only candidate positions in which the input line and the output line are arranged may be provided. Therefore, after arranging the standard cells and the filler cells, a position of at least one of the input line or the output line may be determined, in a portion of the standard cells that provide only candidate positions in which the input line and the output line may be arranged.

Next, a position of the other one of the input line or the output line may be selected (S22). In S21 and S22, a position of the input line may be selected first, and a position of the output line may be selected later, or a position of the output line may be selected first, and a position of the input line may be selected later. At least some of candidate positions of the input line and candidate positions of the output line may overlap each other. Therefore, the positions of the input line and the output line may be sequentially selected, as needed.

When the positions of the input line and the output line are determined in the standard cells, a remaining routing operation may be performed (S23). For example, a routing operation of S23 may include determining positions and lengths of wiring patterns electrically connecting the standard cells to each other, and/or the like, in addition to the input line and the output line arranged in each of the standard cells.

Figure 15A:
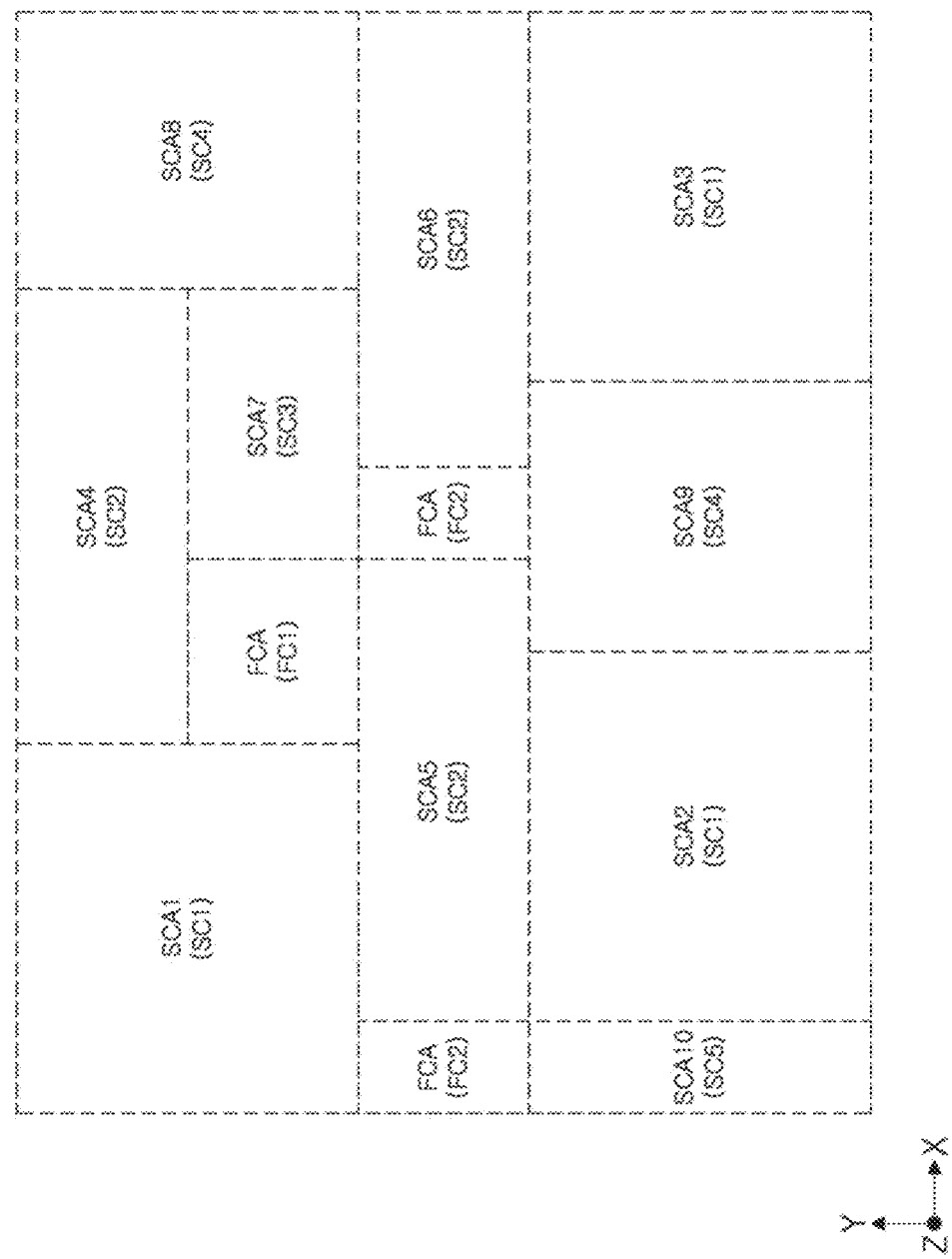
FIGS. 15A and 15B are plan views illustrating a semiconductor device according to example embodiments of the present inventive concepts.
Figure 15B:
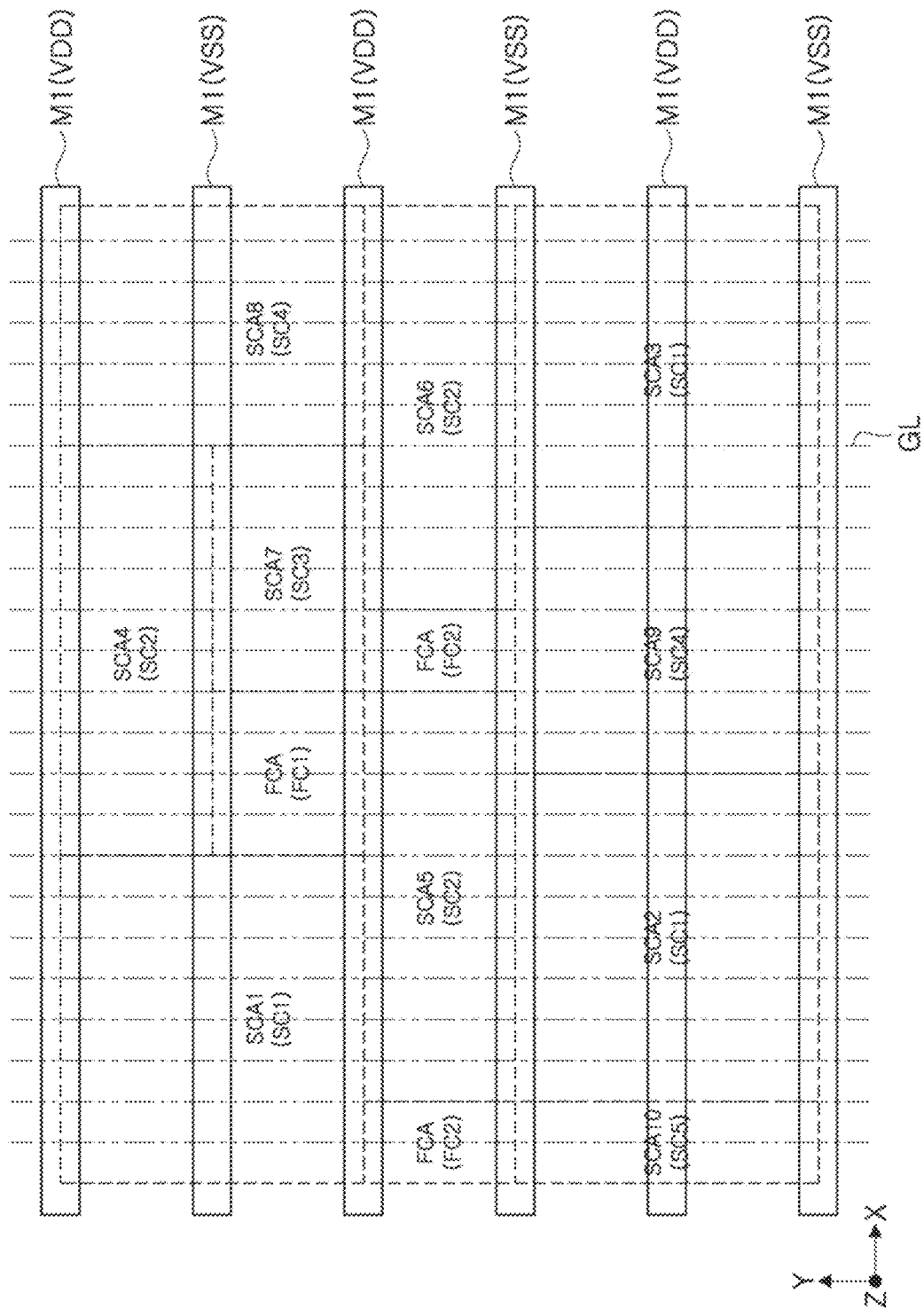

FIGS. 15A and 15B are plan views illustrating a semiconductor device according to example embodiments of the present inventive concepts.

FIG. 15A may be a plan view illustrating a semiconductor device according to example embodiments, and FIG. 15B may be a plan view in which power wiring patterns M1 (VDD) and M1 (VSS) and gate patterns GL are additionally illustrated, based on the plan view of FIG. 15A.

Referring to FIGS. 15A and 15B, a semiconductor device may include standard cell regions SCA1 to SCA10 and filler cell regions FCA1 and FCA2. Standard cells SC1 to SC5 may be disposed in the standard cell regions SCA1 to SCA10, and the standard cells SC1 to SC5 may provide semiconductor elements or/and circuits that actually operate. Filler cells FC1 and FC2 may be disposed in the filler cell regions FCA1 to FCA2.

In example embodiments illustrated in FIGS. 15A and 15B, first to fifth standard cells SC1 to SC5 are illustrated as being disposed in the standard cell regions SCA1 to SCA10, but this is only illustrative, and more various standards cells may be placed in more standard cell regions. Similarly, although first and second filler cells FC1 and FC2 are illustrated as being disposed in the filler cell regions FCA1 and FCA2, more various filler cells may be disposed in more filler cell regions.

The semiconductor device may include power wiring patterns M1 (VDD) and M1 (VSS) extending in the first direction (the X-axis direction). The power wiring patterns M1 (VDD) and M1 (VSS) may be arranged in the second direction (the Y-axis direction) intersecting the first direction. For example, the power wiring patterns M1 (VDD) and M1 (VSS) may extend along a boundary between the standard cell regions SCA1 to SCA10 and the filler cell regions FCA1 and FCA2, or may be traversed in at least one of the standard cell regions SCA1 to SCA10 or the filler cell regions FCA1 and FCA2.

Gate patterns GL may extend in the second direction and may be separated from each other in the first direction. The gate patterns GL may include gate structures providing a semiconductor element, and dummy gate structures. For example, gate patterns GL disposed at boundaries between the standard cell regions SCA1 to SCA10 and the filler cell regions FCA1 and FCA2 may be the dummy gate structures.

Referring to FIGS. 15A and 15B, a first standard cell SC1 may be disposed in first to third standard cell regions SCA1 to SCA3. For example, the same circuit may be implemented in each of the first to third standard cell regions SCA1 to SCA3.

In example embodiments of the present inventive concepts, in at least a portion of the first to third standard cell regions SCA1 to SCA3, at least one of an input line or an output line included in the first standard cell SC1 may be located at a different position from each other. For example, a first standard cell SC1 disposed in the first standard cell region SCA1 may include a first input line and a first output line, and a first standard cell SC1 disposed in the second standard cell region SCA2 may include a second input line and a second output line.

Since the same first standard cell SC1 may be disposed, gate structures connected to the first input line in the first standard cell region SCA1 may be disposed in the same position as gate structures connected to the second input line in the second standard cell region SCA2. Similarly, active regions connected to the first output line in the first standard cell region SCAT may be disposed in the same position as active regions connected to the second output line in the second standard cell region SCA2.

In consideration of routing with other adjacent standard cells SC1 to SC5, a position of the first input line included in the first standard cell SC1 in the first standard cell region SCAT may be different from a position of the second input line included in the second standard cell region SCA2. In addition, a position of the first output line included in the first standard cell SC1 in the first standard cell region SCA1 may be different from a position of the first output line included in the first standard cell SC1 in the second standard cell region SCA2. According to example embodiments, a position of the first input line may be the same as a position of the second input line, and a position of the first output line may be different from a position of the second output line, or a position of the first input line may be different from a position of the second input line, and a position of the first output line may be the same as a position of the second output line. Alternatively, a position of the first input line may be different from a position of the second input line, and a position of the first output line may be different from a position of the second output line.

Figure 16:
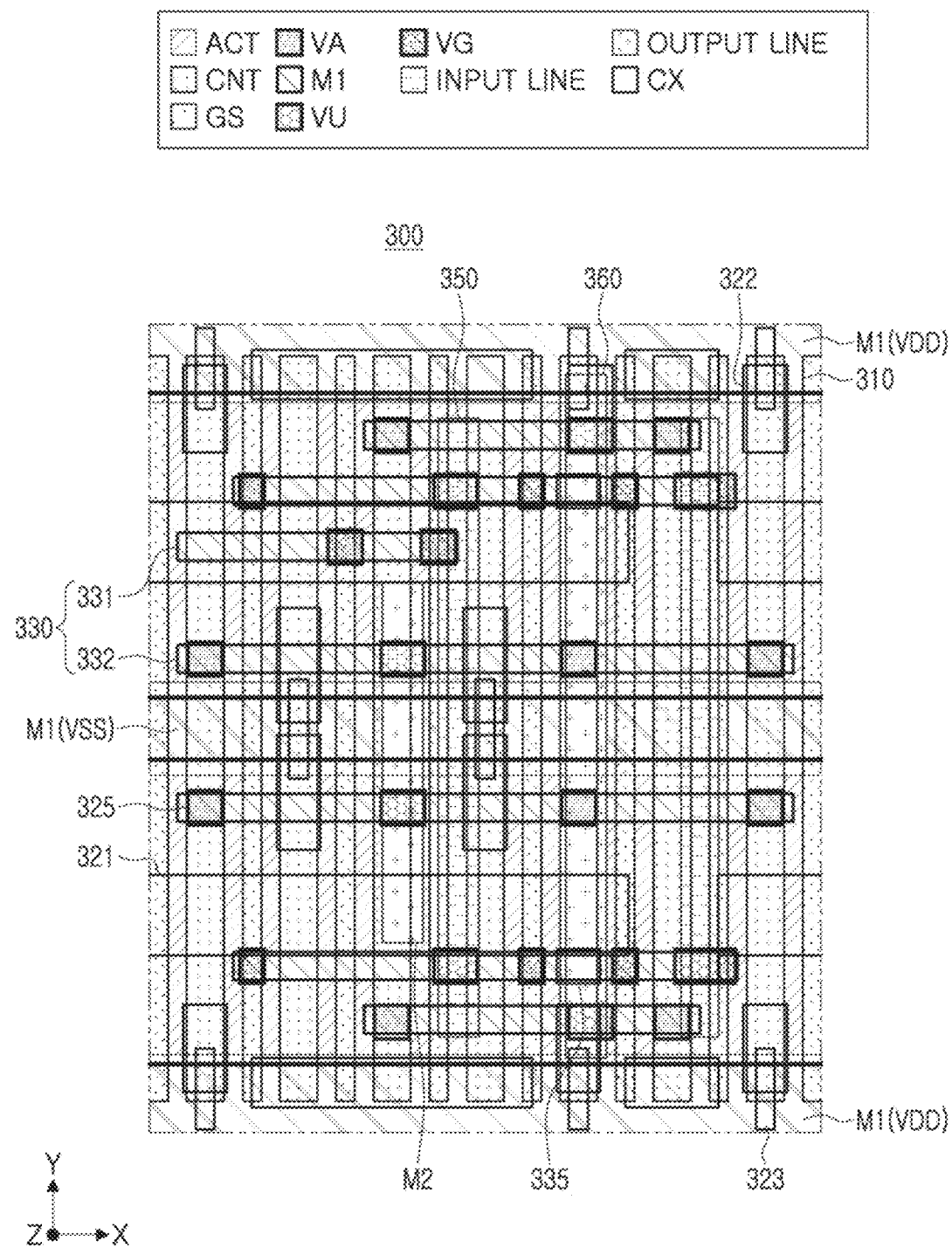
FIG. 16 is a plan view schematically illustrating a standard cell included in a semiconductor device according to example embodiments of the present inventive concepts.
Figure 17:
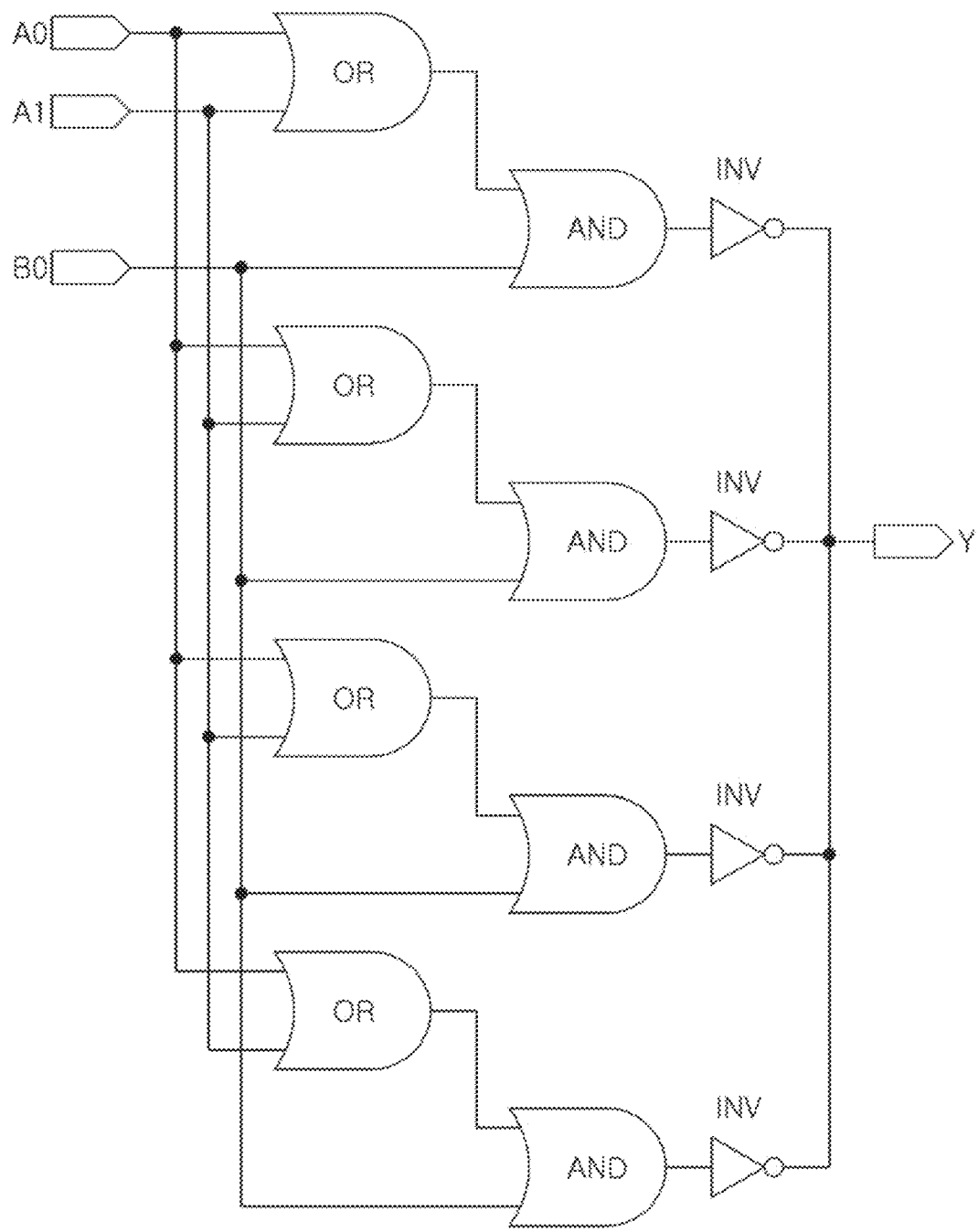
FIG. 17 is a circuit diagram schematically illustrating a circuit provided by the standard cell illustrated in FIG. 16.

FIG. 16 is a plan view schematically illustrating a standard cell included in a semiconductor device according to example embodiments of the present inventive concepts. FIG. 17 is a circuit diagram schematically illustrating a circuit provided by the standard cell illustrated in FIG. 16.

Referring to FIG. 16, in a semiconductor device according to example embodiments of the present inventive concepts, a standard cell 300 may include active regions 305 extending in the first direction (the X-axis direction), and gate structures 310 extending in the second direction (the Y-axis direction) and intersecting the active region 305. The active regions 305 and the gate structures 310 may provide a plurality of semiconductor elements. For example, a gate structure among the gate structures 310, and active regions 305 disposed on both sides of the gate structure may provide a transistor. The active regions 305 may be connected to active contacts 320 adjacent to the gate structures 310. The active contacts 320 may extend in the second direction, and a contact separation region 321 may divide at least a portion of the active contacts 320 into a plurality of regions.

The standard cell 300 may include lower wiring patterns 330 having input wirings 331 connected to at least one of the gate structures 310 through a gate via 315, and output wirings 332 connected to at least one of the active contacts 320 through an active via 325. The lower wiring patterns 330 may be formed of a conductive material such as metal or metal silicide, and may extend in the first direction. The lower wiring patterns 330 may be disposed on the same height as power wiring patterns M1 (VDD) and M1 (VSS). At least one of the lower wiring patterns 330 may be divided into a plurality of regions in the first direction by a wiring pattern separation region 335.

The standard cell 300 according to example embodiments illustrated in FIG. 16 may provide an OR-AND-inverter (OAI) circuit. Referring to FIG. 17, simply illustrating the OAI circuit provided by the standard cell 300, the OAI circuit may include four OR gates (OR), four AND gates (AND), and four inverters (INV). For example, two OR gates (OR), two AND gates (AND), and two inverters (INV) may be arranged above a ground power line M1 (VSS) in the second direction, in layout according to example embodiments illustrated in FIG. 16. The other two OR gates (OR), the other two AND gates (AND), and the other two inverters (INV) may be arranged under the ground power line M1 (VSS) in the second direction, in the layout according to example embodiments illustrated in FIG. 16.

Referring to FIG. 17, four OR gates (OR) may share input signals A0 and A1 with each other, and four AND gates (AND) may also share an input signal B0. Also, the four inverters (INV) may share output signals Y. For example, the input signals A0, A1, and B0 may be commonly input to four OAI circuits, and may be output together with an output signal Y corresponding to the four input signals A0, A1, and B0. Therefore, in the layout illustrated in FIG. 16, input wirings 331 receiving at least one of the input signals A0, A1, or B0 should be connected to each other, and output wirings 332 outputting the output signal Y should be connected to each other. For example, the output signal Y according to the input signals A0, A1, and B0 may be determined as illustrated in Table 1 below.

TABLE 1

| A0 | A1 | B0 | Y |
|----|----|----|---|
| 0  | 0  | 0  | 1 |
| 0  | 0  | 1  | 1 |
| 0  | 1  | 0  | 1 |
| 0  | 1  | 1  | 0 |
| 1  | 0  | 0  | 1 |
| 1  | 0  | 1  | 0 |
| 1  | 1  | 0  | 1 |
| 1  | 1  | 1  | 0 |

Referring to FIG. 16, in the second direction, an input wiring 331 disposed above the ground power line M1 (VSS) and an input wiring 331 disposed below the ground power line M1 (VSS) may be connected to each other by input lines 350. The input lines 350 and the input wirings 331 may be connected to each other by lower input vias 341. For example, an input line 351 of the input lines 350 may be provided as a path for transmitting a second input signal A1, and an input line 352 of the input lines 350 may be provided as a path for transmitting a third input signal B0.

Also, referring to FIG. 16, in the second direction, an output wiring 332 disposed above the ground power line M1 (VSS) and an output wiring 332 disposed below the ground power line M1 (VSS) may be connected to each other by an output line 360. The output line 360 and the output wirings 332 may be connected to each other by lower output vias 342. The four inverters (INV) may output the output signal Y in common by the output line 360.

In example embodiments, the standard cell 300 may be the first standard cell SC1 of the semiconductor device according to example embodiments described with reference to FIGS. 15A and 15B, and may be disposed in the first to third standard cell regions SCA1 to SCA3. In example embodiments illustrated in FIG. 16, positions of the input lines 350 and the output line 360 may be determined in the standard cell 300. For example, in the standard cell 300, the input lines 350 and the output line 360 may always be disposed at the same position. Therefore, a degree of freedom in wiring design for connecting semiconductor elements may be inevitably reduced, and when a length of another wiring increases by the input lines 350 and the output line 360 that have already been determined for their positions, resistance and capacitance may increase, to deteriorate performance of a semiconductor device including the standard cell 300.

In example embodiments of the present inventive concepts, positions of at least one of the input lines 350 and the output line 360 may not be fixed in the standard cell 300. In the standard cell 300, only candidate positions in which the input lines 350 and the output line 360 may be arranged may be defined, and among the candidate positions in the wiring and routing operation, the input lines 350 and the output line 360 may be selected. Hereinafter, it will be described in more detail with reference to FIGS. 18 to 20.

Figure 18:
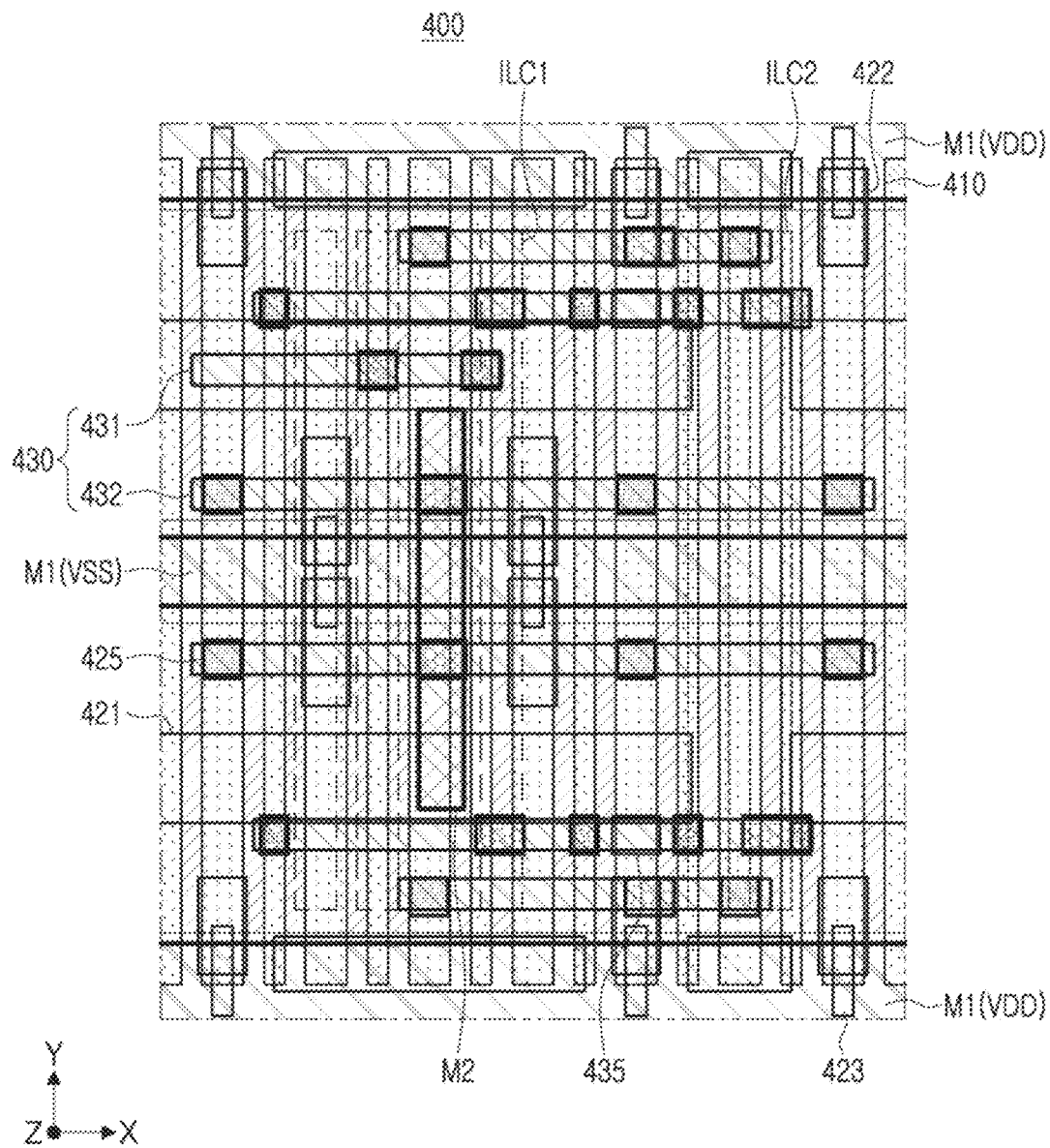
FIGS. 18 to 20 are views illustrating a method of placing an input line and an output line in a standard cell included in a semiconductor device according to example embodiments of the present inventive concepts.
Figure 19:
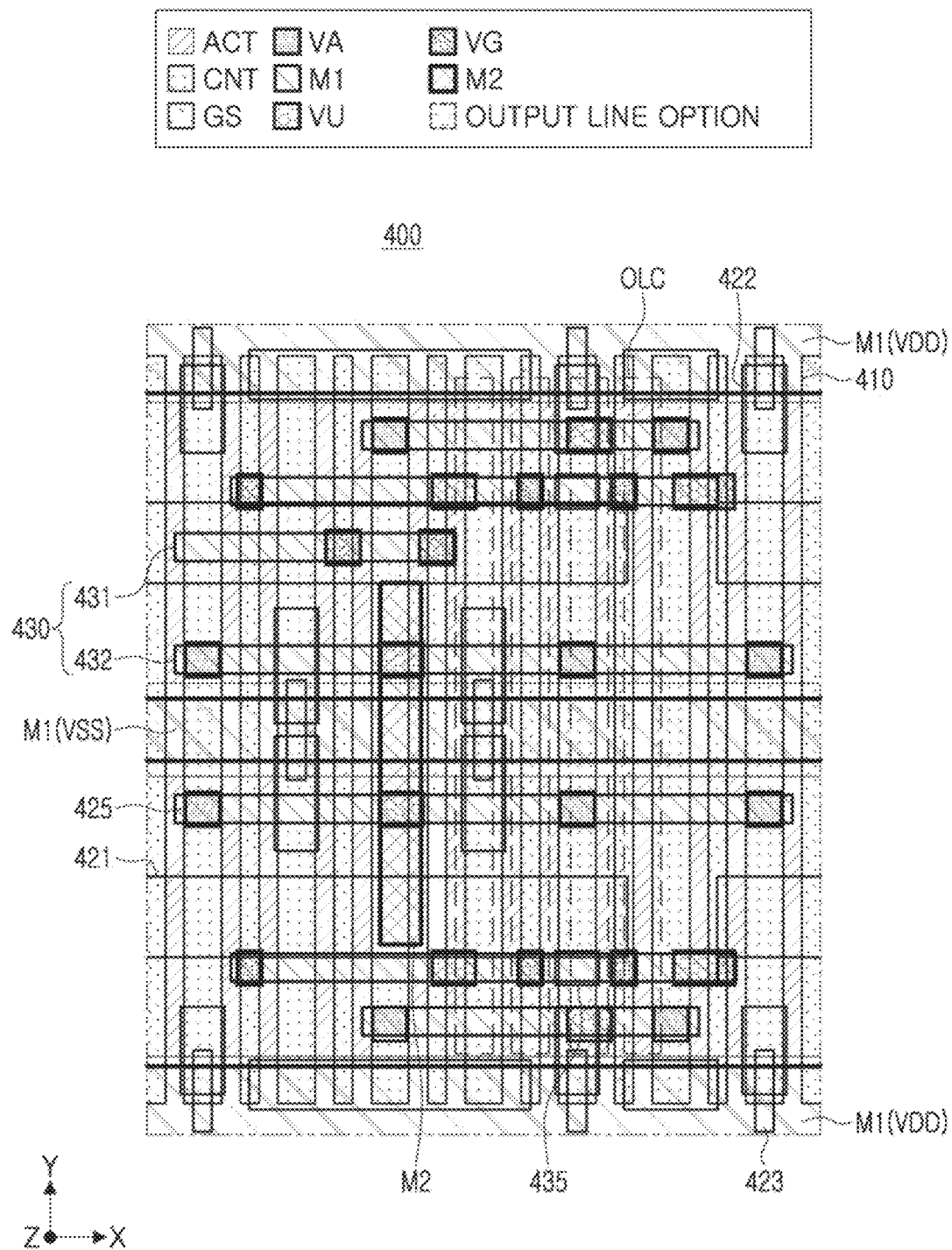
Figure 20:
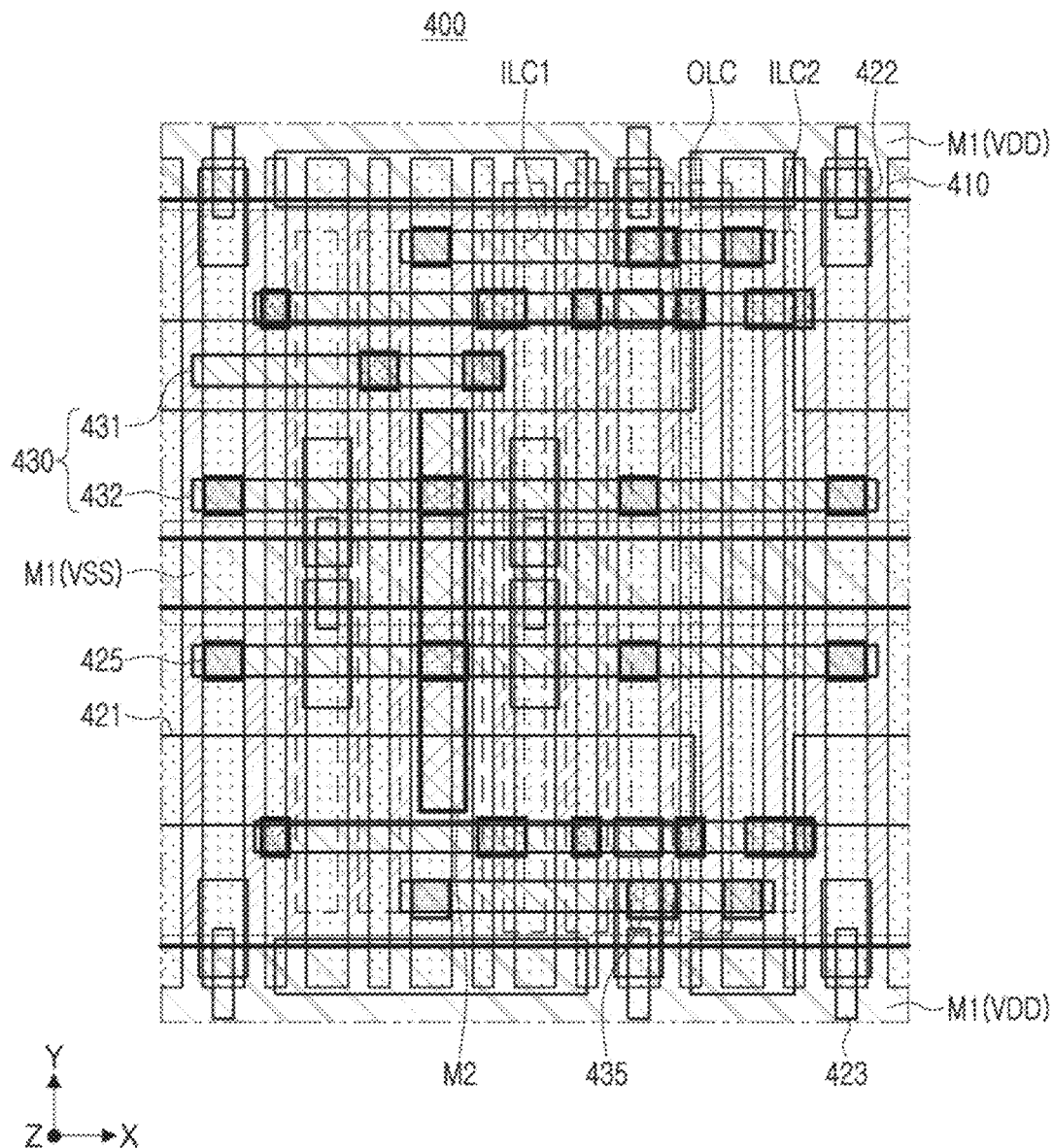

FIGS. 18 to 20 are views illustrating a method of placing an input line and an output line in the standard cell illustrated in FIG. 16.

A standard cell 400 according to example embodiments illustrated in FIGS. 18 to 20 may be the same circuit as the standard cell 300 according to example embodiments described with reference to FIG. 16 above, e.g., the OAI circuit according to example embodiments illustrated in FIG. 17. Therefore, arrangement of active regions 405, gate structures 410, gate vias 415, active contacts 420, contact separation regions 421, active vias 425, lower wiring patterns 430, wiring pattern separation region 435, and power wiring patterns M1 (VDD) and M1 (VSS) may be the same as that described with reference to FIG. 16.

In example embodiments described with reference to FIGS. 18 to 20, positions of input lines and output lines may not be determined, and only candidate positions ILC1, ILC2, and OLC in which the input lines and the output lines may be arranged may be provided. Referring first to FIG. 18, a plurality of input candidate positions ILC1 and ILC2 in which input lines may be arranged may be defined in the standard cell 400. In a placing and routing operation of a design process, a position of an input line for receiving a second input signal A1 from among the plurality of input candidate positions ILC1 and ILC2 may be selected from among three first input candidate positions ILC1, and a position of an input line for receiving a third input signal B0 may be selected from among two second input candidate positions ILC2.

The first input candidate positions ILC1 and the second input candidate positions ILC2 may be defined, in consideration of a distance between wiring patterns formed in a second wiring layer in which input lines and output lines are disposed, a width of each of the wiring patterns, lengths, positions, and/or the like of input wirings 431 to be connected by the input lines, and/or the like. For example, at least a portion of the first input candidate positions ILC1 may be disposed on both sides of an intermediate wiring pattern M2 in the first direction, in consideration of the intermediate wiring pattern M2 of the second wiring layer to which position is fixed.

Next, referring to FIG. 19, a plurality of output candidate positions OLC in which an output line may be disposed may be defined in the standard cell 400. In a placing and routing operation of a design process, one of the plurality of output candidate positions OLC may be selected, and an output line may be formed at the selected position. A position of each of the plurality of output candidate positions OLC may be determined, in consideration of a design rule of the second wiring layer in which the output line is to be formed, and lengths, positions, and/or the like of output wirings 432 to be connected to each other by the output line.

Referring to FIG. 20, at least one of the plurality of input candidate positions ILC1 and ILC2 may overlap at least one of the plurality of output candidate positions OLC. Therefore, when selection of the plurality of input candidate positions ILC1 and ILC2 is first performed, a restriction may occur in selection of one of the plurality of output candidate positions OLC. Alternatively, when one of the plurality of output candidate positions OLC is first selected, a restriction may occur in selection of one of the plurality of input candidate positions ILC1 and ILC2. Which the plurality of input candidate positions ILC1 and ILC2 and the plurality of output candidate positions OLC are first selected may be variously changed.

Since positions of the input lines may be selected from among the plurality of input candidate positions ILC1 and ILC2, and positions of the output line may be selected from among the plurality of output candidate positions OLC, in at least a portion of the standard cells 400 arranged in different standard cell regions in a semiconductor device, positions of at least one of the input lines or the output lines may be determined differently. For example, when the standard cell 400 described with reference to FIGS. 18 to 20 corresponds to the first standard cell SC1 of the semiconductor device according to example embodiments illustrated in FIG. 15A, positions of input lines in a first standard cell SC1 disposed in the first standard cell region SCAT may be different from positions of input lines in a first standard cell SC1 disposed in the second standard cell region SCA2. Alternatively, a position of an output line in a first standard cell SC1 disposed in the first standard cell region SCA1 may be different from a position of an output line in a first standard cell SC1 disposed in the second standard cell region SCA2.

Since OAI circuits disposed above and below a ground power line M1 (VSS) should receive input signals in common and should output an output signal in common, at least one of the input lines or the output line may extend in the second direction to intersect the ground power line M1 (VSS). Since the ground power line M1 (VSS) is disposed on the first wiring layer, and the input lines and the output line are disposed on the second wiring layer, at least one of the input lines or the output line may intersect the ground power line M1 (VSS) on the ground power line M1 (VSS).

FIGS. 21 to 24 are views schematically illustrating standard cells disposed in different positions in a semiconductor device according to example embodiments of the present inventive concepts.

Standard cells 400A to 400D illustrated in FIGS. 21 to 24 may provide the OAI circuit illustrated in FIG. 17, and may include input lines 450A to 450D and output lines 460A to 460D, formed on positions selected from among the plurality of candidate positions ILC1, ILC2, and OLC described with reference to FIGS. 18 to 20. In example embodiments illustrated in FIGS. 21 to 24, each of the output lines 460A to 460D may extend in the second direction, to electrically connect active regions 405 doped with impurities of different conductivity types and separated from each other in the second direction, to each other.

Also, referring to FIGS. 21 to 24, the active regions 405 doped with impurities of different conductivity types and separated from each other in the second direction may be electrically connected to each other, even by active contacts 420 intersecting a ground power line M1 (VSS). As a result, output wirings 432 disposed in different positions in the second direction may be electrically connected to each other by the active contacts 420 intersecting the ground power line M1 (VSS). For example, output wirings 432 disposed above and below a ground power line M1 (VSS) in the second direction may be electrically connected to two or more active regions 405 by the active contacts 420 intersecting the ground power line M1 (VSS).

Figure 21:
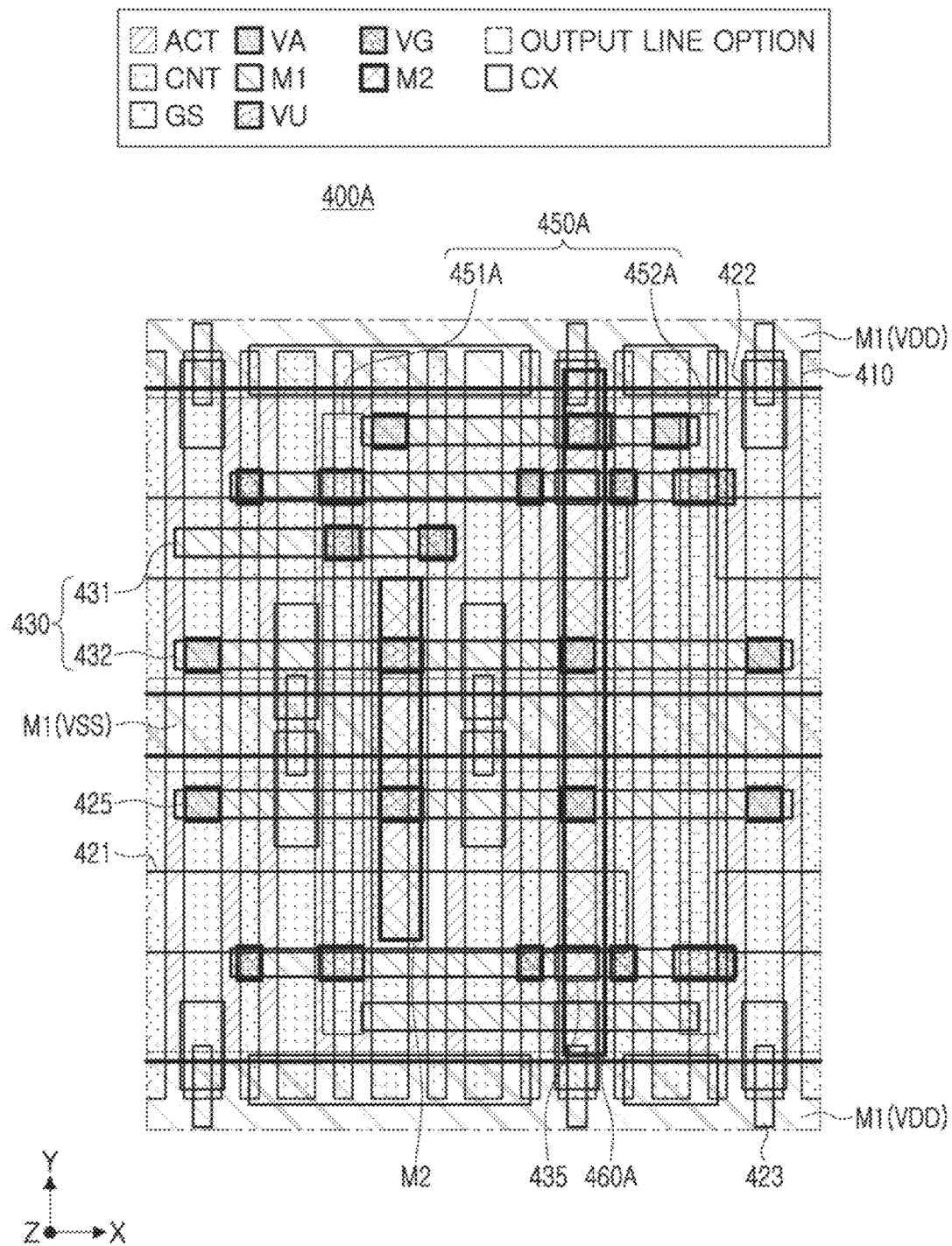
FIGS. 21 to 24 are views schematically illustrating standard cells disposed in different positions in a semiconductor device according to example embodiments of the present inventive concepts.

First, in the standard cell 400A according to example embodiments illustrated in FIG. 21, an input line 451A transmitting a second input signal A1 may be formed on a center position among first input candidate positions ILC1. An input line 452A transmitting a third input signal B0 may be formed at a right position among second input candidate positions ILC2, and an output line 460A may be formed at a third position from a left side among output candidate positions OLC.

For example, referring to FIG. 21, an input line 451A transmitting a second input signal A1 may be disposed on the same position as one of gate structures 410 in the first direction. In some example embodiments, the expression "being disposed at the same location" can be understood to mean that a center of the input line 451A and a center of one of the gate structures 410 are disposed at the same location in the first direction.

Figure 22:
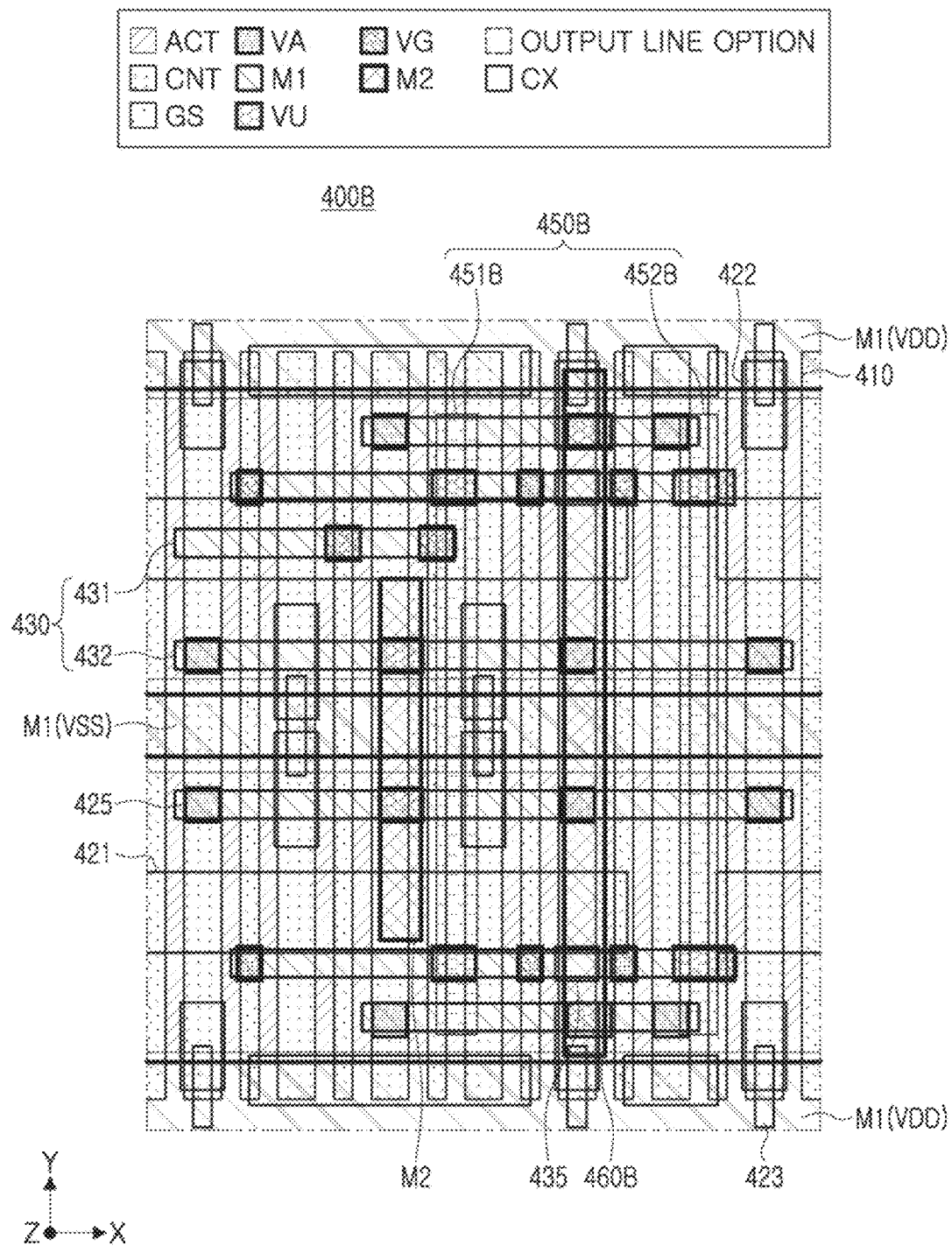

Next, in the standard cell 400B according to example embodiments illustrated in FIG. 22, an input line 451B transmitting a second input signal A1 may be to be formed at a right position among first input candidate positions ILC1. An input line 452B transmitting a third input signal B0 may be formed at a right position among second input candidate positions ILC2, and an output line 460B may be formed at a third position from a left side among output candidate positions OLC. Therefore, comparing the standard cells 400A and 400B illustrated in FIGS. 21 and 22, the input lines 451A and 451B transmitting a second input signal A1 may be disposed in different positions in the first direction. Also, the input lines 451A and 451B transmitting a second input signal A1 may be disposed at the same position in the second direction.

Figure 23:
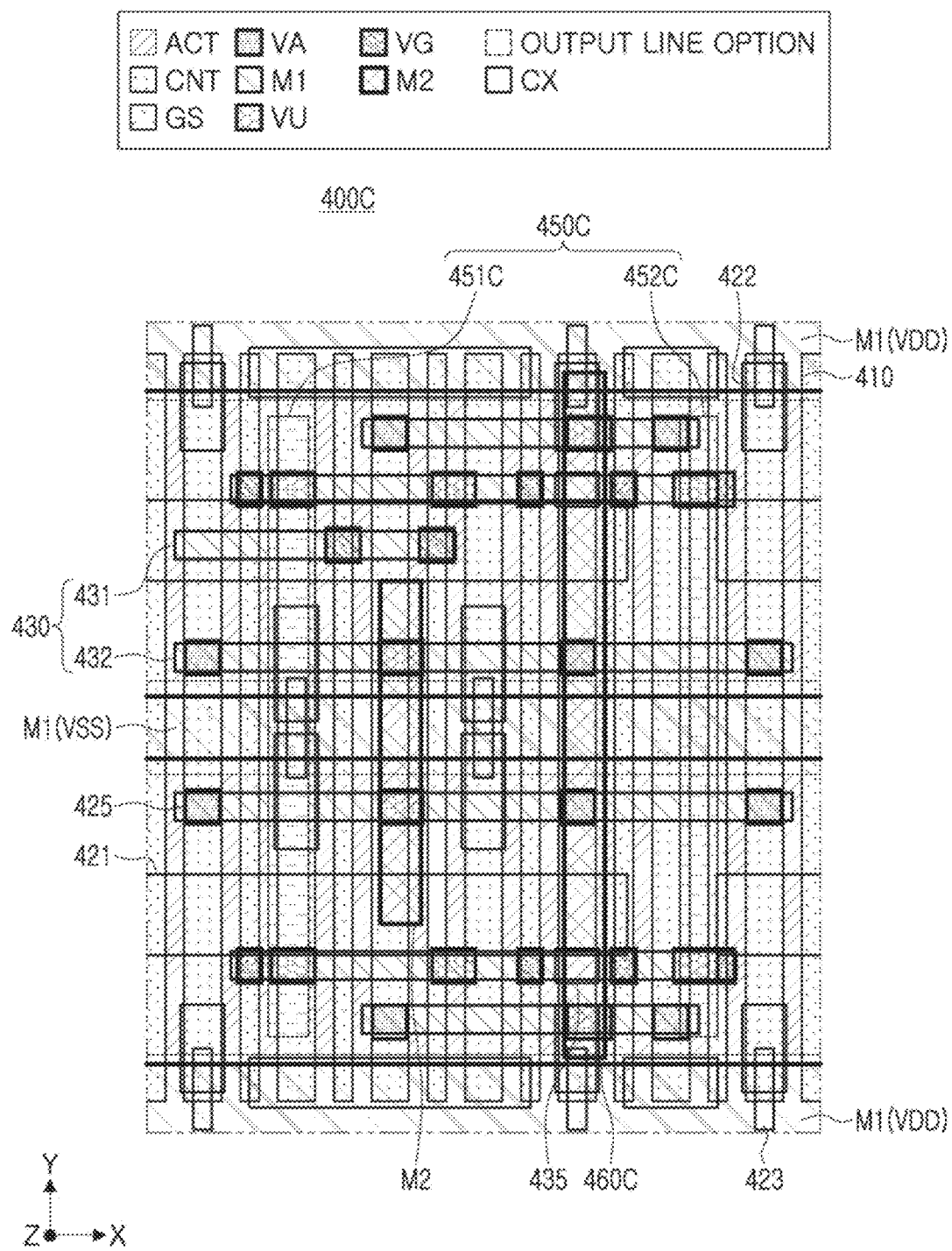

Referring to FIG. 23, an input line 451C transmitting a second input signal A1 in the standard cell 400C may be formed at a left position among first input candidate positions ILC1. An input line 452C transmitting a third input signal B0 may be formed at a right position among second input candidate positions ILC2, and an output line 460C may be formed at a third position from a left side among output candidate positions OLC. Therefore, comparing the standard cells 400A to 400C illustrated in FIGS. 21 to 23, the input lines 451A to 451C transmitting a second input signal A1 may be disposed in different positions in the first direction.

Figure 24:
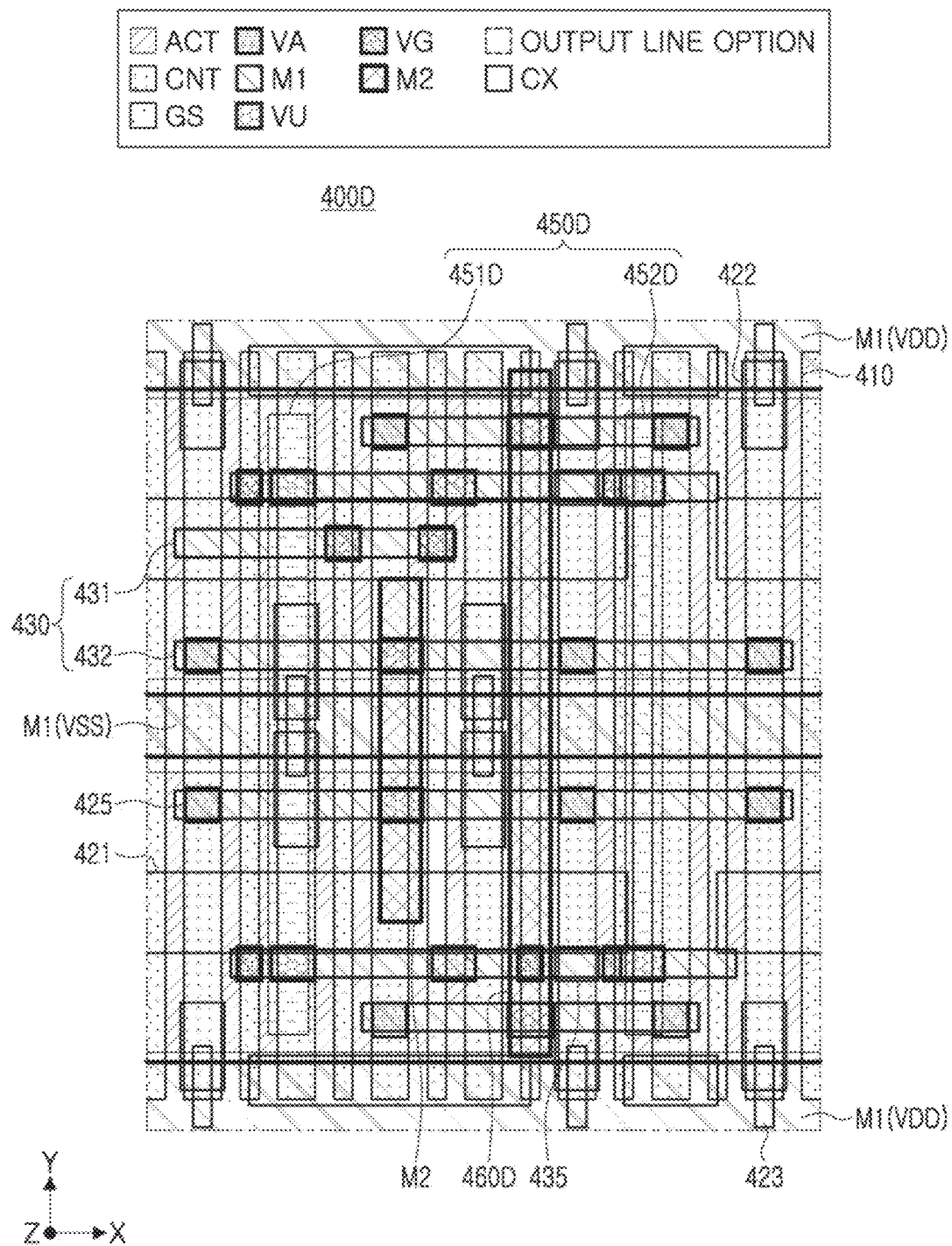

Referring to FIG. 24, an input line 451D transmitting a second input signal A1 in the standard cell 400D may be formed at a left position among first input candidate positions ILC1. An input line 452D transmitting a third input signal B0 may be formed at a left position among second input candidate positions ILC2, and an output line 460D may be formed at a second position from a left side among output candidate positions OLC. Comparing the standard cells 400A and 400D illustrated in FIGS. 21 and 24, the input lines 451A and 451D transmitting a second input signal A1, the input lines 452A and 452D transmitting a third input signal B0, and the output lines 460A and 460D may all be disposed in different positions in the first direction. In addition, comparing the standard cells 400C and 400D illustrated in FIGS. 23 and 24, distances between the input lines 451C and 451D transmitting a second input signal A1 and the input lines 452C and 452D transmitting a third input signal B0 may be different from each other.

At least some of the standard cells 400A to 400D described with reference to FIGS. 21 to 24 may be disposed in the first to third standard cell regions SCA1 to SCA3 of the semiconductor device according to example embodiments illustrated in FIGS. 15A and 15B, as first standard cells SC1. For example, the standard cell 400A according to example embodiments illustrated in FIG. 21 may be disposed in the first standard cell region SCA1 as a first standard cell SC1, and the standard cell 400D according to example embodiments illustrated in FIG. 24 may be disposed in the second standard cell region SCA2 as a first standard cell SC1. In some example embodiments, positions of the input lines 450A of the first standard cell SC1 disposed in the first standard cell region SCA1 may be different from positions of the input lines 450D of the first standard cell SC1 disposed in the second standard cell region SCA2.

In addition, a position of the output line 460A of the first standard cell SC1 disposed in the first standard cell region SCA1 may be different from a position of the output line 460D of the first standard cell SC1 disposed in the second standard cell region SCA2. Therefore, in a plurality of standard cells disposed in different standard cell regions to provide the same circuit in a semiconductor device, input lines or/and output lines may be disposed in different positions.

FIGS. 25 to 28 are views schematically illustrating standard cells disposed in different positions in a semiconductor device according to example embodiments of the present inventive concepts.

Figure 25:
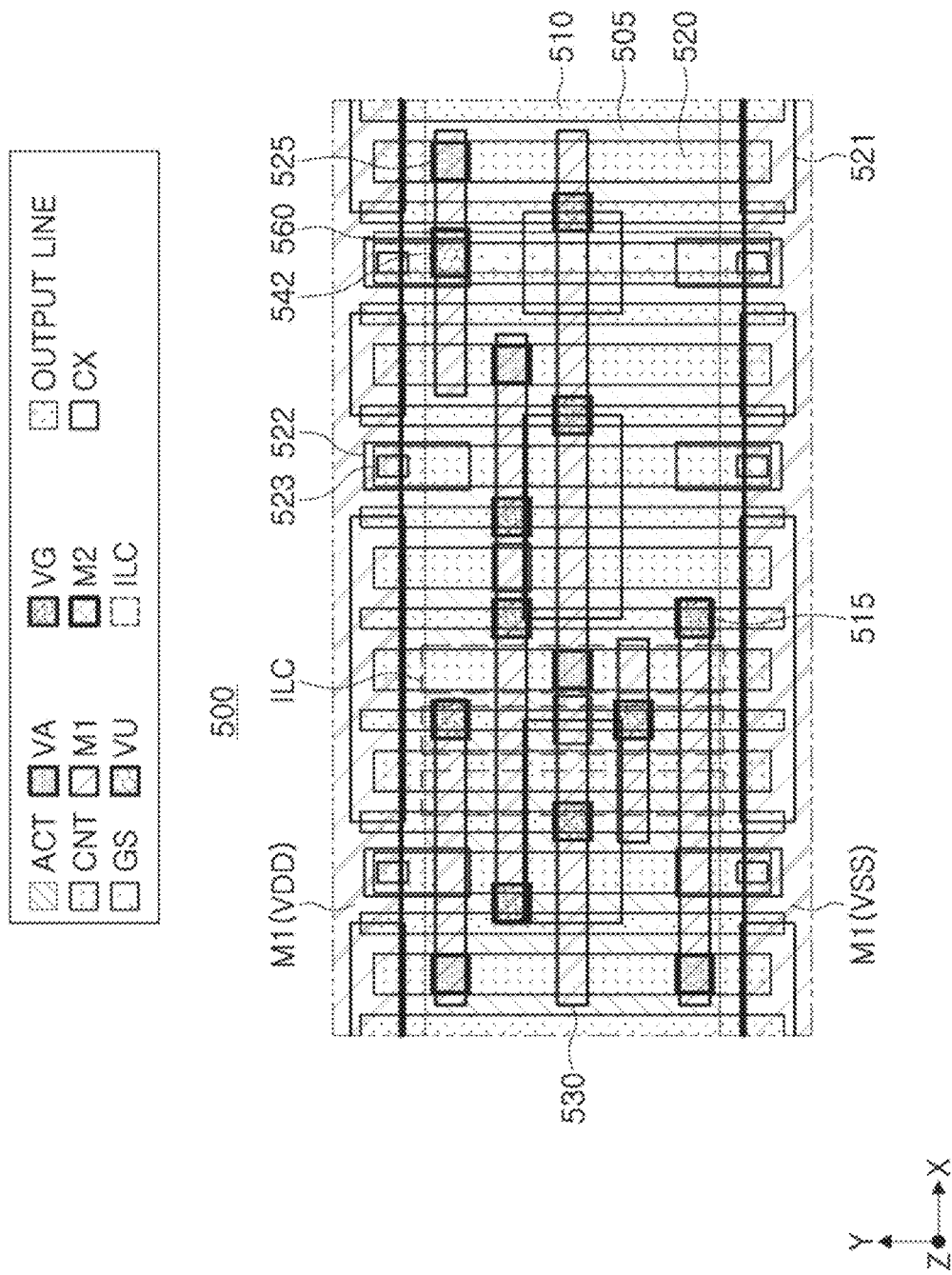
FIGS. 25 to 28 are views schematically illustrating standard cells disposed in different positions in a semiconductor device according to example embodiments of the present inventive concepts.
Figure 26:
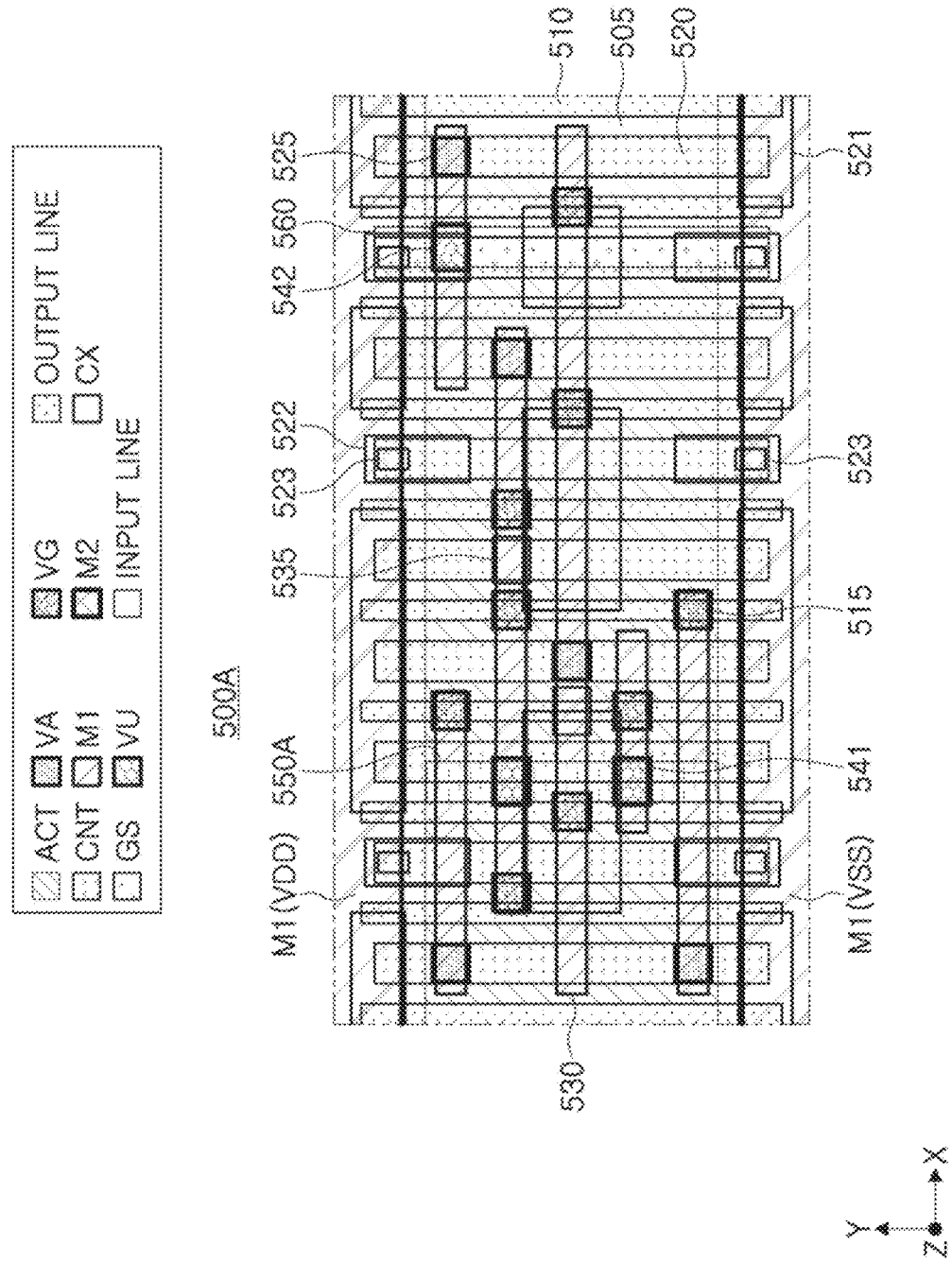
Figure 27:
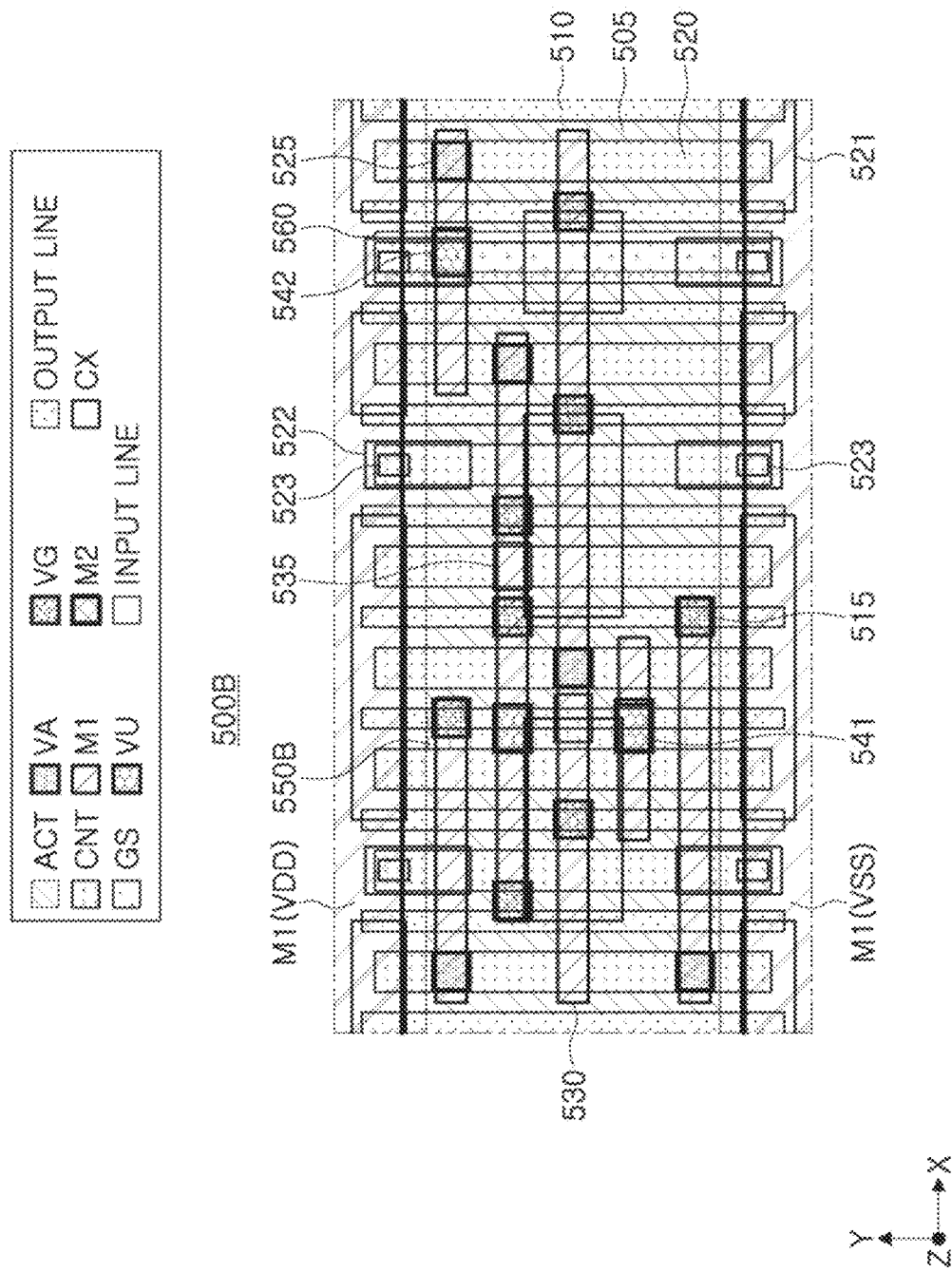
Figure 28:
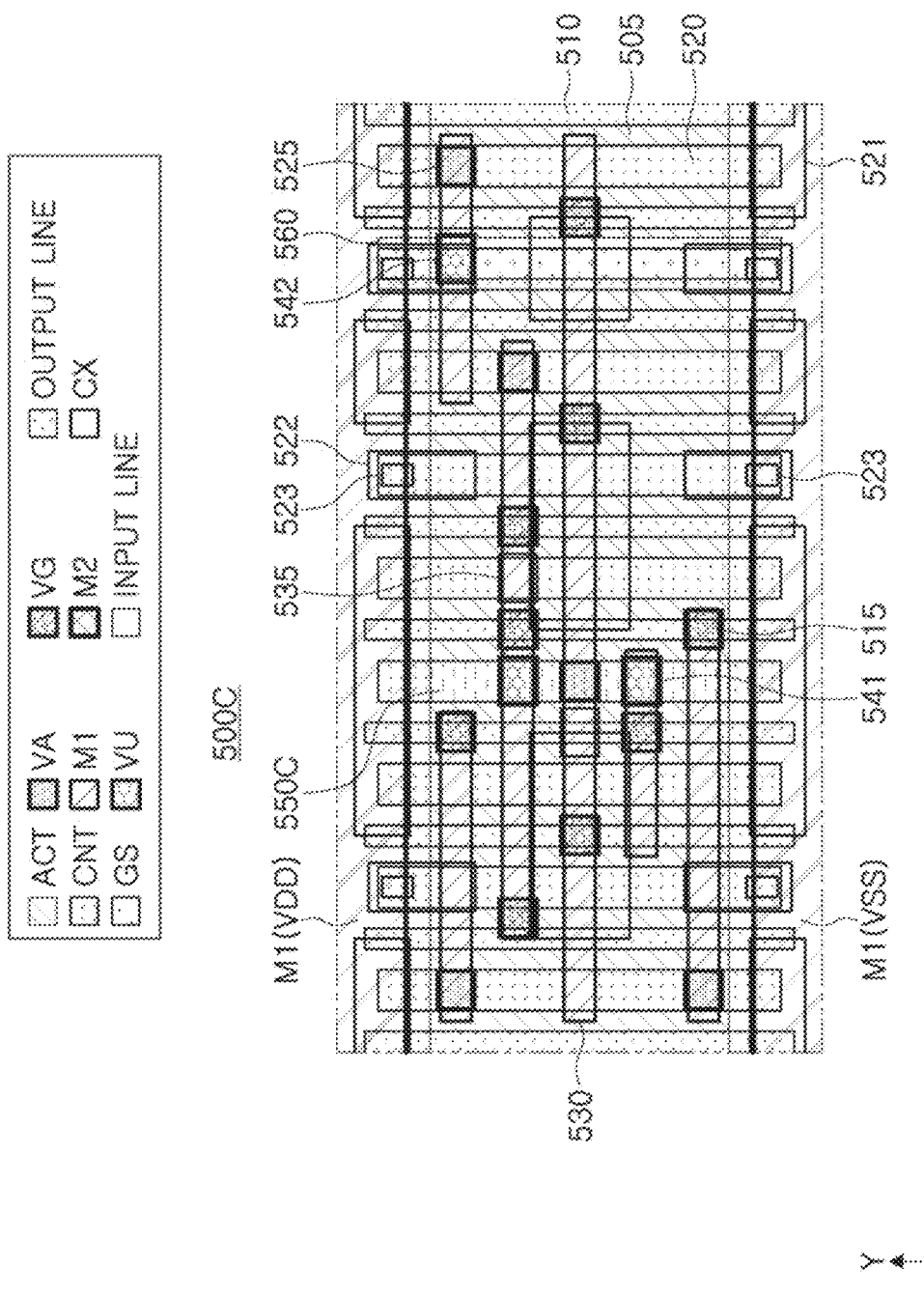

Referring to FIG. 25, in a semiconductor device according to example embodiments of the present inventive concepts, a standard cell 500 may include active regions 505 extending in the first direction (the X-axis direction), and gate structures 510 extending in the second direction (the Y-axis direction) and intersecting the active region 505. The active regions 505 and the gate structures 510 may provide a plurality of semiconductor devices. The active regions 505 may be connected to active contacts 520 adjacent to the gate structures 510. The active contacts 520 may extend in the second direction, and a contact separation region 521 may divide at least a portion of the active contacts 520 into a plurality of regions.

The standard cell 500 may include lower wiring patterns 530 having input wirings 531 connected to at least one of the gate structures 510 through a gate via 515, and output wirings 532 connected to at least one of the active contacts 520 through an active via 525. The lower wiring patterns 530 may be formed of a conductive material such as metal or metal silicide, and may extend in the first direction. The lower wiring patterns 530 may be disposed on the same height as power lines M1 (VDD) and M1 (VSS). At least one of the lower wiring patterns 530 may be divided into a plurality of regions in the first direction by a wiring pattern separation region 535.

The standard cell 500 according to example embodiments illustrated in FIG. 25 may provide a latch circuit. For example, the latch circuit provided by the standard cell 500 may be a gate-type D latch circuit. Referring to FIG. 25, a position of an output line 560 for outputting an output signal of the latch circuit in the standard cell 500 may be predetermined. A position of an input line for receiving an input signal, among input signals of the latch circuit, and transmitting the input signal in common to two or more input wirings 531 may not be predetermined in the standard cell 500, and only candidate positions ILC may be defined in the standard cell 500.

A position of an input line may be selected as one of the candidate positions ILC in a placing and routing operation. For example, in a standard cell 500A according to example embodiments illustrated in FIG. 26, an input line 550A may be disposed on a leftmost position among candidate positions ILC. In a standard cell 500B according to example embodiments illustrated in FIG. 27, an input line 550B may be disposed on a center position among candidate positions ILC, and, in a standard cell 500C according to example embodiments illustrated in FIG. 28, an input line 550C may be disposed on a rightmost position among candidate positions ILC. For example, referring to FIG. 28, the input line 550C may be disposed at the same position as one of active contacts 520 in the first direction. In some example embodiments, the expression "being disposed at the same location" can be understood to mean that a center of the input line 550C and a center of one of the active contacts 520 are disposed at the same location in the first direction.

In example embodiments, the standard cell 500 according to example embodiments illustrated in FIG. 25 may be included as the second standard cell FC2 in the semiconductor device according to example embodiments illustrated in FIGS. 15A and 15B. Therefore, the standard cell 500 may be disposed in the fourth to sixth standard cell regions SCA4 to SCA6 as the second standard cell FC2, respectively.

In example embodiments of the present inventive concepts, in the second standard cell SC2 disposed in the fourth to sixth standard cell regions SCA4 to SCA6, positions of the input lines may be different from each other. For example, the standard cell 500A described with reference to FIG. 26 may be disposed in the fourth standard cell region SCA4 as a second standard cell SC2, and the standard cell 500B described with reference to FIG. 27 may be disposed in the fifth standard cell region SCA5 as a second standard cell SC2. Also, the standard cell 500C described with reference to FIG. 28 may be disposed in the sixth standard cell region SCA6 as a second standard cell SC3. Therefore, in standard cells that are disposed in standard cell regions at different locations in a semiconductor device to provide the same circuit, input lines may be disposed at different locations.

Referring to FIGS. 25 to 28, a position of the output line 560 may be fixed, and only positions of the input lines 550A to 550C may be selectively changed. Therefore, in the second standard cell SC2 disposed in the fourth to sixth standard cell regions SCA4 to SCA6, distances between each of the input lines 550A to 550C and the output line 560 may be different. For example, a distance between the input line 550A and the output line 560 in the second standard cell SC2 disposed in the fourth standard cell region SCA4 in the first direction may be different from a distance between the input line 550B and the output line 560 in the second standard cell SC2 disposed in the fifth standard cell region SCA5 in the first direction. A similar description may also be applied to example embodiments described with reference to FIGS. 21 to 24.

Figure 29:
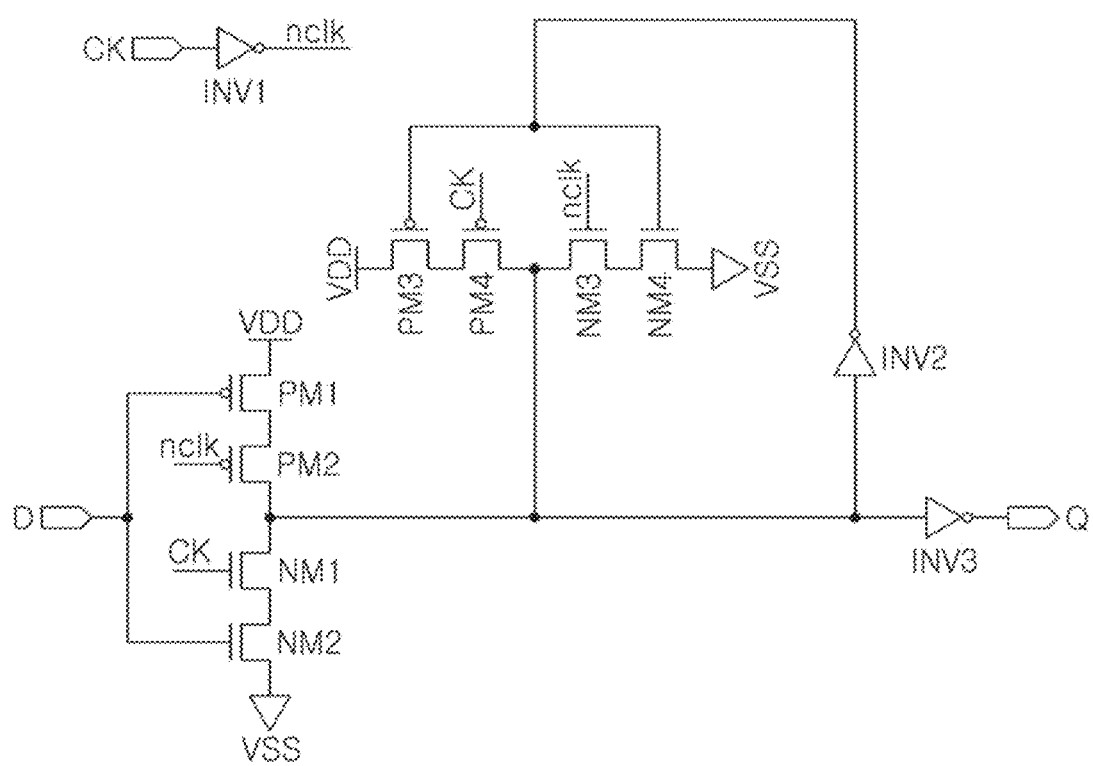
FIG. 29 is a circuit diagram schematically illustrating a circuit provided by the standard cell illustrated in FIGS. 25 to 28.

FIG. 29 is a circuit diagram schematically illustrating a circuit provided by the standard cell illustrated in FIGS. 25 to 28.

Referring to FIG. 29, a circuit provided by the standard cell described with reference to FIGS. 25 to 28 may be a latch circuit. Referring to FIG. 29, the latch circuit may receive an input signal D and a clock signal CK, and may invert the clock signal CK to generate an inverted clock signal nclk. A first inverter INV1 may be included in the standard cell.

During a first time period when the clock signal CK has a high level and the inverted clock signal nclk has a low level, the input signal D may be stored in the latch circuit. For example, the input signal D may be input to a gate of a first PMOS element PM1 and a gate of a second NMOS element NM2 in common. During the first time period, a second PMOS element PM2 and a first NMOS element NM1, connected between the first PMOS element PM1 and the second NMOS element NM2, may be turned on. Therefore, when the input signal D is 0, the first PMOS element PM1 may be turned on, a power voltage VDD may be input to a third inverter INV3, an output signal Q may be determined to be a low level, and the input signal D, as it is, may be reflected in the output signal Q. Conversely, when the input signal D is 1, the output signal Q may have a high level.

During a second time period when the clock signal CK has a low level and the inverted clock signal nclk has a high level, the latch circuit may maintain the input signal D, as it is, received at the first time as the output signal Q. During the second time period, the second PMOS element PM2 and the first NMOS element NM1 may be turned off, and a fourth PMOS element PM4 and a third NMOS element NM3 may be turned on. A signal having the same level as the output signal Q may be input to a gate of a third PMOS element PM3 and a gate of a fourth NMOS element NM4 by a second inverter INV2.

For example, when the output signal Q has a low level during the first time period, the third PMOS element PM3 may be turned on, and the power voltage VDD may be input to a third inverter INV3, to maintain the output signal Q at a low level. When the output signal Q has a high level during the first time period, the fourth NMOS element NM4 may be turned on, and a ground voltage VSS may be input to the first inverter INV1, to maintain the output signal Q at a high level.

According to example embodiments of the present inventive concepts, there may be provided a semiconductor device including standard cells and filler cells disposed between the standard cells. In two or more first standard cells disposed at different locations and providing the same circuit, at least one of an input line or an output line may be disposed at different locations. By selecting a position of at least one of the input line or the output line from among a plurality of candidate groups in place & routing operations for arranging and connecting the standard cells, a degree of design freedom may increase, and wirings may be efficiently arranged.

Various advantages and effects of the present inventive concepts are not limited to the above, and will be more easily understood in the process of describing specific example embodiments of the present inventive concepts.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
a plurality of standard cells in a first direction and a second direction, parallel to an upper surface of a substrate and intersecting with each other, and each of the plurality of standard cells having two or more gate structures and two or more active regions,
wherein the plurality of standard cells comprise first standard cells in a first standard cell region and a second standard cell region, defined in different positions in at least one of the first direction or the second direction, and the first standard cells provide a same circuit,
wherein the first standard cell in the first standard cell region comprises a first input line connecting input wirings that are connected to two or more gate structures of the first standard cell in the first standard cell region to each other, and a first output line connecting output wirings that are connected to two or more active regions of the first standard cell in the first standard cell region to each other, and
the first standard cell in the second standard cell region comprises a second input line connecting input wirings that are connected to two or more gate structures of the first standard cell in the second standard cell region to each other, and a second output line connecting output wirings that are connected to two or more active regions of the first standard cell in the second standard cell region to each other,
wherein a position of the first input line in the first standard cell region is different from a position of the second input line in the second standard cell region, or a position of the first output line in the first standard cell region is different from a position of the second output line in the second standard cell region.

2. The semiconductor device of claim 1, wherein, in the first direction, the position of the first input line in the first standard cell region is different from the position of the second input line in the second standard cell region, and
in the second direction, the position of the first input line in the first standard cell region is the same as the position of the second input line in the second standard cell region.

3. The semiconductor device of claim 1, wherein, in the first direction, the position of the first output line in the first standard cell region is different from the position of the second output line in the second standard cell region, and
in the second direction, the position of the first output line in the first standard cell region is the same as the position of the second output line in the second standard cell region.

4. The semiconductor device of claim 1, wherein, in the first direction, the position of the first input line in the first standard cell region is the same as the position of the second input line in the second standard cell region, and
in the second direction, the position of the first input line in the first standard cell region is different from the position of the second input line in the second standard cell region.

5. The semiconductor device of claim 1, wherein, in the first direction, the position of the first output line in the first standard cell region is the same as the position of the second output line in the second standard cell region, and
in the second direction, the position of the first output line in the first standard cell region is different from the position of the second output line in the second standard cell region.

6. The semiconductor device of claim 1, wherein, in each of the plurality of standard cells, the active regions extend in the first direction, and the gate structures extend in the second direction, and each of the plurality of standard cells comprises active contacts connected between the active regions and the output wirings, gate vias connected between the gate structures and the input wirings, and active vias connected between the active contacts and the output wirings.

7. The semiconductor device of claim 6, wherein the gate vias connected to the input wirings connected to each other by at least one of the first input line or the second input line are in different positions in the first direction.

8. The semiconductor device of claim 6, wherein the output wirings connected to each other by at least one of the first output line or the second output line are connected to the active regions doped with impurities of different conductivity types by the active contacts.

9. The semiconductor device of claim 6, wherein at least one of the two or more gate structures connected to each other by at least one of the first input line or the second input line is commonly connected to the input wirings by the gate vias.

10. The semiconductor device of claim 6, wherein at least one of the two or more active regions connected to each other by at least one of the first output line or the second output line is commonly connected to the output wirings by the active contacts.

11. The semiconductor device of claim 1, wherein at least one of the first input line or the second input line is at a same position as at least one of the gate structures in the first direction.

12. The semiconductor device of claim 1, wherein, in the first direction, a width of each of the first input line, the second input line, the first output line, and the second output line is greater than a width of each of the gate structures.

13. The semiconductor device of claim 1, further comprising: a plurality of power lines extending in the first direction and separated from each other in the second direction, wherein the plurality of power lines are at a same height as the input wirings and the output wirings.

14. The semiconductor device of claim 13, wherein at least one of the first input line, the second input line, the first output line, or the second output line extends in the second direction to intersect at least one of the plurality of power lines.

15. A semiconductor device comprising:
a plurality of standard cells in a first direction and a second direction, parallel to an upper surface of a substrate and intersecting with each other, and each of the plurality of standard cells having two or more gate structures and two or more active regions,
wherein the plurality of standard cells comprise first standard cells in a first standard cell region and a second standard cell region, defined in different positions in at least one of the first direction or the second direction, and the first standard cells provide a same circuit,
wherein the first standard cell in the first standard cell region comprises a first input line connecting input wirings that are connected to two or more gate structures of the first standard cell in the first standard cell region to each other, and a first output line connecting output wirings that are connected to two or more active regions of the first standard cell in the first standard cell region to each other, and
the first standard cell in the second standard cell region comprises a second input line connecting input wirings that are connected to two or more gate structures of the first standard cell in the second standard cell region to each other, and a second output line connecting output wirings that are connected to two or more active regions of the first standard cell in the second standard cell region to each other,
wherein a position of the first input line in the first standard cell region is different from a position of the second input line in the second standard cell region, and a position of the first output line in the first standard cell region is different from a position of the second output line in the second standard cell region.

16. A semiconductor device comprising:
a plurality of standard cells in a first direction and a second direction, parallel to an upper surface of a substrate and intersecting with each other, and each of the plurality of standard cells having two or more gate structures and two or more active regions,
wherein the plurality of standard cells comprise first standard cells in a first standard cell region and a second standard cell region, defined in different positions in at least one of the first direction or the second direction, and the first standard cells provide a same circuit,
wherein the first standard cell in the first standard cell region comprises a first input line connecting two or more gate structures of the first standard cell in the first standard cell region to each other and extending in the second direction, and a first output line connecting two or more active regions of the first standard cell in the first standard cell region to each other and extending in the second direction, and
the first standard cell in the second standard cell region comprises a second input line connecting two or more gate structures of the first standard cell in the second standard cell region to each other and extending in the second direction, and a second output line connecting two or more active regions of the first standard cell in the second standard cell region to each other and extending in the second direction,
wherein a distance between the first input line and the first output line is different from a distance between the second input line and the second output line, in the first direction.

17. The semiconductor device of claim 16, wherein a position of the first input line in the first standard cell region is different from a position of the second input line in the second standard cell region, and a position of the first output line in the first standard cell region in the first direction is different from a position of the second output line in the second standard cell region in the first direction.

18. The semiconductor device of claim 16, wherein a position of the first input line in the first standard cell region is the same as a position of the second input line in the first direction in the second standard cell region, and a position of the first output line in the first standard cell region is different from a position of the second output line in the second standard cell region in the first direction.

19. The semiconductor device of claim 16, wherein a position of the first input line in the first standard cell region is different from a position of the second input line in the second standard cell region in the first direction, and
a position of the first output line in the first standard cell region is the same as a position of the second output line in the second standard cell region in the first direction.

20. The semiconductor device of claim 16, wherein the first standard cells in the first standard cell region comprise a plurality of the first input line, and the first standard cells in the second standard cell region comprise a plurality of the second input line, and
a distance between the first input lines in the first standard cell region is different from a distance between the second input lines in the second standard cell region.

* * * * *